(12) United States Patent
Mizuta et al.

(10) Patent No.: US 8,803,067 B2
(45) Date of Patent: Aug. 12, 2014

(54) MULTI-WIRING LAYER SOLID-STATE IMAGING DEVICE WITH INCREASED SENSITIVITY, ELECTRONIC APPARATUS, AND METHOD FOR MANUFACTURING SAME

(71) Applicant: Sony Corporation, Tokyo (JP)

(72) Inventors: Kyohei Mizuta, Kanagawa (JP); Kazuichiro Itonaga, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/867,808

(22) Filed: Apr. 22, 2013

(65) Prior Publication Data

US 2013/0241019 A1 Sep. 19, 2013

Related U.S. Application Data

(63) Continuation of application No. 12/765,432, filed on Apr. 22, 2010, now Pat. No. 8,445,827.

(30) Foreign Application Priority Data

May 12, 2009 (JP) .................................. 2009-115843

(51) Int. Cl.
*H01L 31/00* (2006.01)

(52) U.S. Cl.
USPC ...................... 250/214.1; 250/208.1; 257/431; 257/432; 257/444

(58) Field of Classification Search
USPC ................. 250/208.1, 214.1, 214 R, 214 DC; 257/431, 432, 443, 444, 458, 461
See application file for complete search history.

(56) References Cited

U.S. PATENT DOCUMENTS

| | | | |
|---|---|---|---|
| 2006/0086956 A1* | 4/2006 | Furukawa et al. | 257/291 |
| 2006/0141653 A1 | 6/2006 | Choi | |
| 2009/0032853 A1* | 2/2009 | Kim | 257/292 |
| 2009/0108389 A1 | 4/2009 | Inoue | |

FOREIGN PATENT DOCUMENTS

| | | |
|---|---|---|
| JP | 2006-080522 | 3/2006 |
| JP | 2008-270500 | 11/2008 |
| JP | 2009-099626 | 5/2009 |

OTHER PUBLICATIONS

Partial European Search Report for European Patent Application No. 10004648.1 dated Apr. 15, 2013, 8 pages.

* cited by examiner

*Primary Examiner* — Francis M Legasse, Jr.
(74) *Attorney, Agent, or Firm* — Sheridan Ross P.C.

(57) ABSTRACT

A solid state imaging device is described that includes a semiconductor substrate having a plurality of photodiodes thereon. The solid state imaging device further includes a first wiring portion, a second wiring portion and a third wiring portion. The device further includes a first wiring layer over the semiconductor substrate and which includes a plurality of metal films and extends across all the wiring portions. Additionally, a second wiring layer is disposed over the first wiring layer and which extends across the first wiring portion and the second wiring portion.

25 Claims, 26 Drawing Sheets

MULTI-WIRING LAYER SOLID-STATE IMAGING DEVICE WITH INCREASED SENSITIVITY, ELECTRONIC APPARATUS, AND METHOD FOR MANUFACTURING SAME

RELATED APPLICATION DATA

The present application claims priority to and contains subject matter related to that disclosed in Japanese Patent Application JP 2009-115843 filed in the Japan Patent Office on May 12, 2009, the entire content of which is hereby incorporated by reference to the extent permitted by law.

BACKGROUND OF THE INVENTION

The present invention relates to solid-state imaging devices, e.g., CMOS image sensors or CCD image sensors. The invention also relates to electronic apparatus including a solid-state imaging device, and a method for manufacturing a solid-state imaging device.

Solid-state imaging devices, for example, complementary metal-oxide semiconductor (CMOS) image sensors and charge coupled device (CCD) image sensors, have been developed previously. A solid-state imaging device has a configuration, in which a photodiode (photoelectric conversion element) is disposed on the surface of a semiconductor substrate and when light is incident on the photodiode, an image signal is obtained on the basis of a signal charge generated in the photodiode. Furthermore, regarding a solid-state imaging device having the above-described configuration, in order to improve the optical characteristics, various configurations have been proposed previously (refer to Japanese Unexamined Patent Application Publication Nos. 2000-150846 and 2004-273791, for example).

FIG. 26 shows a schematic configuration sectional view of a solid-state imaging device proposed in Japanese Unexamined Patent Application Publication No. 2000-150846. A solid-state imaging device 100 described in this document is composed of a light-receiving portion 101 including photoelectric conversion elements 104 arranged on the surface of a semiconductor substrate 103 one-dimensionally or two-dimensionally and a peripheral circuit portion 102 disposed in the periphery thereof. Furthermore, the solid-state imaging device 100 is provided with microlenses 108 and/or a color filters 107 disposed on the light-receiving portion 101 with an interlayer film 111 and wirings 105 therebetween. In this regard, the interlayer film 111, an etching stopper layer 112, a protective film 113, and a wiring layer including wirings 106 are disposed on the semiconductor substrate 103 of the peripheral circuit portion 102.

Moreover, regarding the solid-state imaging device 100 described in Japanese Unexamined Patent Application Publication No. 2000-150846, the thickness di of the wiring layer of the light-receiving portion 101 is specified to be smaller than the thickness dc of the wiring layer of the peripheral circuit portion 102. Consequently, the light-condensing efficiency of the microlens 108 is improved and a color-mixing problem of the color filter 107 is avoided.

In addition, FIG. 27 shows a schematic sectional view in the vicinity of the boundary between a peripheral circuit portion and a sensor portion of a solid-state imaging device proposed in Japanese Unexamined Patent Application Publication No. 2004-273791. In the configuration of a solid-state imaging device 150 described in this document, a plurality of wiring layers 161 to 163 are laminated on a substrate 160 of a peripheral circuit portion 151 with flattening film layers 165 therebetween, and the surface height of the laminated layer is reduced stepwise toward a sensor portion 152. According to such a configuration, a sharp change in height at the boundary between the peripheral circuit portion 151 and the sensor portion 152 is reduced, and the film thickness of a predetermined upper layer 164 disposed on the sensor portion 152 is made almost uniform all over the surface of the sensor portion 152, so as to facilitate an improvement of the optical characteristics.

As described above, Japanese Unexamined Patent Application Publication Nos. 2000-150846 and 2004-273791 propose technologies to form a height difference at the boundary between the sensor portion and the peripheral circuit portion. In Japanese Unexamined Patent Application Publication No. 2004-273791, this technology is applied to a solid-state imaging device produced by an aluminum (Al) wiring process. This technology can also be applied to a solid-state imaging device produced by a copper (Cu) process.

FIG. 28, while not prior art, is an illustrative example of the problem encountered by the inventors. FIG. 28 depicts a configuration sectional view of a solid-state imaging device in the case where the above-described technology is applied to the solid-state imaging device produced by the Cu wiring process. In this regard, FIG. 28 shows a configuration example in the case where a solid-state imaging device 200 is a CMOS image sensor.

The solid-state imaging device 200 is provided with a semiconductor substrate 201 and a wiring layer portion including metal films 205 and light-shielding layers 206 deposited with interlayer insulating layers 203 and capping films 204 therebetween. Furthermore, the solid-state imaging device 200 is provided with a passivation film 207, a layer of color filter 208, and a layer of on-chip lens 209. Moreover, the wiring layer portion, the passivation film 207, the layer of color filter 208, and the layer of on-chip lens 209 are laminated on the semiconductor substrate 201 in that order. In this regard, FIG. 28 shows an example in which the wiring layer portion is composed of five wiring layers 1MT to 5MT.

In addition, the solid-state imaging device 200 is composed of a sensor portion region 220 and a peripheral circuit region 230 including, for example, a vertical drive circuit and a horizontal drive circuit on a semiconductor substrate 201. A plurality of pixels 240 including photodiodes 202 serving as photoelectric conversion elements and pixel transistors (MOS transistors: not shown in the drawing) are arranged two-dimensionally on the surface of the semiconductor substrate 201 in the sensor portion region 220.

Furthermore, the sensor portion region 220 includes an effective pixel region 221, which outputs image signals actually, and an invalid pixel region 222, which does not output an image signal actually. Moreover, the sensor portion region 220 includes an optical black region (hereafter referred to as OPB region) 223, which outputs a reference signal at a black level. In this regard, the invalid pixel region 222 and the OPB region 223 are disposed at desired locations in the periphery of the effective pixel region 221.

Then, in the solid-state imaging device 200, the thickness of the wiring layer portion 220a in the sensor portion region 220 is specified to be smaller than the thickness of the wiring layer portion 230a in the peripheral circuit region 230. Consequently, a height difference portion 210 is formed at the boundary between the sensor portion region 220 and the peripheral circuit region 230.

However, in the solid-state imaging device 200 having the above-described configuration, the light-shielding layers 206 in the OPB region 223 are disposed as layers above the wiring layer 2MT and, thereby, it is difficult to reduce the distance between the photodiode 202 and the on-chip lens 209 sufficiently. Consequently, regarding the solid-state imaging device 200 in the related art, a problem occurs in that the optical sensitivity of the photodiode 202 is not improved sufficiently.

SUMMARY OF THE INVENTION

The present invention provides a solid state imaging device, and a method of producing the same, where the distance from the surface on the light incident side of the device to the pixel is reduced resulting in greater sensitivity.

In accordance with systems consistent with the present disclosure, a solid state imaging device includes a semiconductor substrate having a plurality of photodiodes thereon and a first wiring portion, a second wiring portion and a third wiring portion, a first wiring layer over the semiconductor substrate and which includes a plurality of metal films and extends across all the wiring portions, and a second wiring layer over the first wiring layer and which extends across the first wiring portion and the second wiring portion.

In accordance with systems consistent with the present disclosure, a method of creating a solid state imaging device includes the steps of forming a plurality of photodiodes in a third wiring portion of a semiconductor substrate which has a first wiring portion, a second wiring portion and the third wiring portion, forming over the semiconductor substrate a first wiring layer which includes a plurality of metal films and which extends across all the wiring portions, and forming over the first wiring layer a second wiring layer which extends over the first wiring portion and the second wiring portion.

In accordance with systems consistent with the present disclosure, an electronic apparatus includes an optical system, a solid-state imaging device which receives light from the optical system, the solid-state imaging device including a semiconductor substrate having a plurality of photodiodes thereon and a first wiring portion, a second wiring portion and a third wiring portion, a first wiring layer over the semiconductor substrate and which includes a plurality of metal films and extends across all the wiring portions, and a second wiring layer over the first wiring layer and which extends across the first wiring portion and the second wiring portion.

Other systems, methods, features, and advantages of the present application will be or will become apparent to one with skill in the art upon examination of the following figures and detailed description. It is intended that all such additional systems, methods, features, and advantages be included within this description, be within the scope of the disclosure, and be protected by the accompanying claims.

DETAILED DESCRIPTION OF THE PRESENTLY PREFERRED EMBODIMENTS

The configuration examples of solid-state imaging devices according to embodiments of the present invention and an electronic apparatus including the same will be described below with reference to the drawings in the following order. In this regard, the present invention is not limited to the examples described below.

1. Basic configuration example of solid-state imaging device
2. Configuration example of solid-state imaging device including light waveguide layer
3. One configuration example of electronic apparatus including solid-state imaging device according to embodiment of present invention

1. First Embodiment

Configuration of Solid-state Imaging Device

Figure 1:
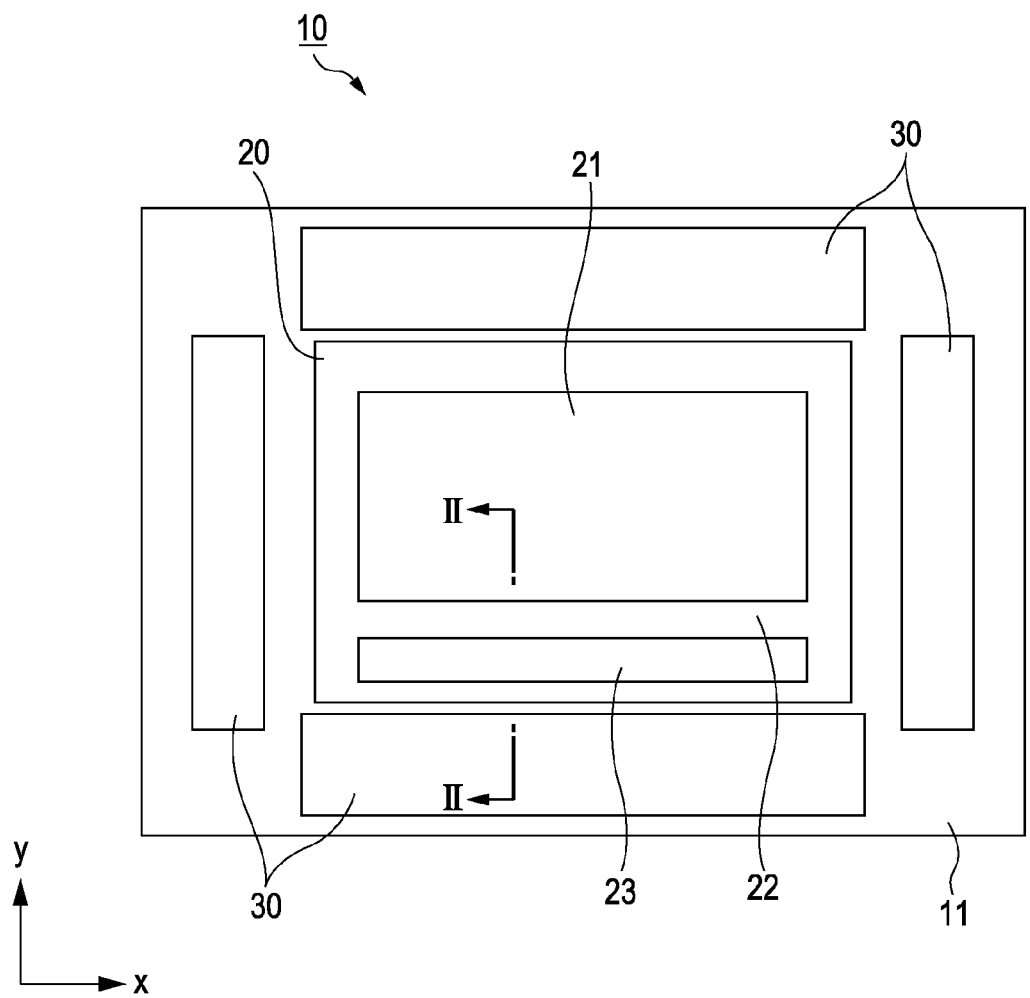
FIG. 1 is a schematic configuration diagram of a solid-state imaging device according to a first embodiment.

FIG. 1 shows a schematic configuration of a solid-state imaging device according to a first embodiment. In the present embodiment, a solid-state imaging device 10 will be described with reference to a CMOS image sensor as an example. The solid-state imaging device 10 mainly includes a sensor portion region 20 (pixel array region) disposed on a semiconductor substrate 11 and a peripheral circuit region 30 disposed in the periphery thereof.

The sensor portion region 20 is composed of an effective pixel region 21, which outputs image signals, an invalid pixel region 22, which does not output an image signal, and an OPB region 23, which outputs a reference signal at a black level. In this regard, the invalid pixel region 22 and the OPB region 23 are disposed at desired locations in the periphery of the effective pixel region 21. The disposition locations of the invalid pixel region 22 and the OPB region 23 may be changed depending on the characteristics of the device. Furthermore, a plurality of pixels 40, as described later, are arranged in a two-dimensional array on the surface of the semiconductor substrate 11 in the sensor portion region 20.

Although not shown in the drawing, the peripheral circuit region 30 includes, for example, a vertical drive circuit, a column signal processing circuit, a horizontal drive circuit, an output circuit, and a control circuit.

The vertical drive circuit includes, for example, a shift register, which selectively scans individual pixels of the sensor portion region 20 sequentially on a line by line basis in the vertical direction (for example, the y direction shown in FIG. 1). Then, pixel signals on the basis of signal charges generated in accordance with the amount of received light in the photodiodes of the individual pixels are supplied to a column signal processing circuit. The column signal processing circuit is disposed, for example, on a pixel line basis, and conducts signal processing, e.g., noise removal and signal amplification, of signals output from one line of pixels based on the signals from each line of pixels in the OPB region 23. The horizontal drive circuit includes, for example, a shift register, and outputs horizontal scanning pulses sequentially, so as to select a predetermined column signal processing circuit among a plurality of column signal processing circuits in the predetermined order and to output a pixel signal. The output circuit sequentially outputs signals from the individual column signal processing circuits to predetermined signal processing circuits. Then, the control circuit controls the above-described individual circuits on the basis of vertical synchronized signals, horizontal synchronized signals, and a master clock.

Figure 2:
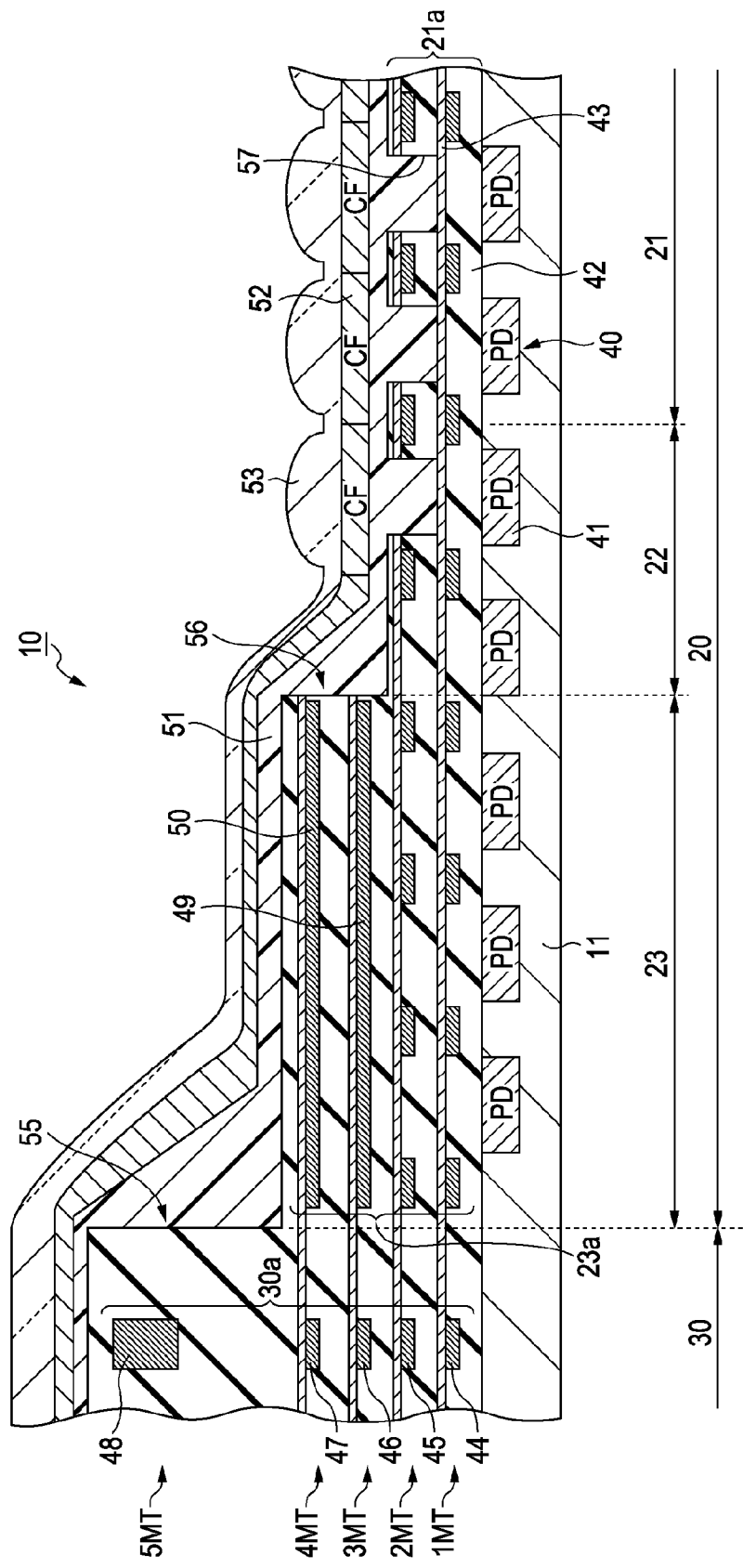
FIG. 2 is a sectional view of the section taken along a line II-II shown in FIG. 1.

FIG. 2 shows a schematic sectional configuration of the solid-state imaging device 10 according to the present embodiment. In this regard, FIG. 2 is a sectional view of the section taken along a line II-II shown in FIG. 1 and is a sectional view in the periphery of the boundary between the sensor portion region 20 and the peripheral circuit regions 30.

The solid-state imaging device 10 is provided with a semiconductor substrate 11, wiring layer portions 21a, 23a, and 30a, a passivation film 51, a layer of color filter 52, and a layer of on-chip lens 53. In this regard, the wiring layer portions 21a, 23a, and 30a, the passivation film 51, the layer of color filter 52, and the layer of on-chip lens 53 are laminated on the semiconductor substrate 11 in that order.

The semiconductor substrate 11 (substrate) is formed from, for example, a silicon substrate, and on the surface thereof, a plurality of pixels 40 including photodiodes 41 and pixel transistors (MOS transistors: not shown in the drawing) are arranged two-dimensionally.

The passivation film 51 is formed from, for example, silicon nitride (SiN: refractive index 2.0), which is a material having a refractive index higher than that of silicon oxide ($SiO_2$: refractive index 1.45) or the like serving as a material for forming an interlayer insulating layer 42, as described later.

The color filter 52 is formed from, for example, a photoresist containing a colorant. Furthermore, the on-chip lens 53 is formed from, for example, silicon oxide ($SiO_2$). In the example shown in the present embodiment, the on-chip lens 53 is disposed in the invalid pixel region 22. However, no on-chip lens 53 may be disposed in the invalid pixel region 22 if the color filter 52 has a light-condensing function.

Figure 3:
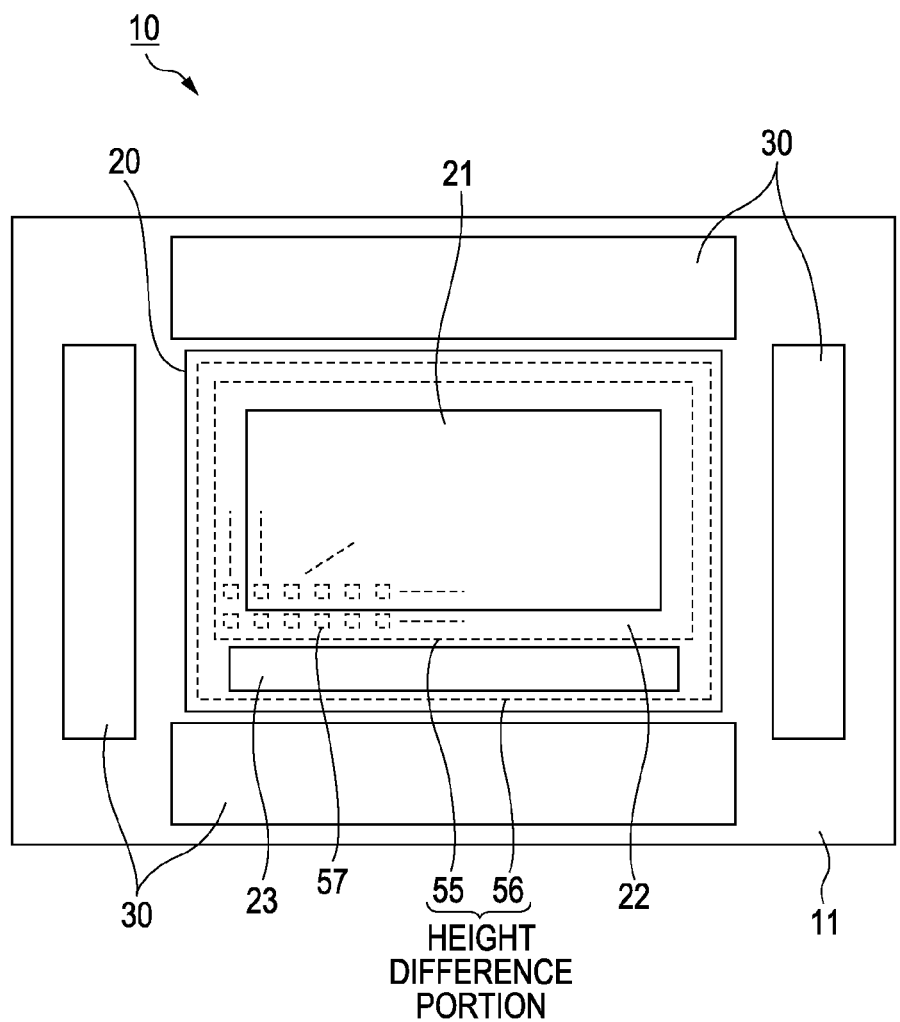
FIG. 3 is a diagram showing a positional relationship between individual regions constituting the solid-state imaging device according to the first embodiment and height difference portions and concave portions.

Moreover, in the present embodiment, the film configurations of the wiring layer portions 21a, 23a, and 30a disposed on the semiconductor substrate 11 are different depending on the regions constituting the solid-state imaging device 10, as shown in FIG. 3. Here, the film configurations of wiring layer portions disposed in the individual regions will be described. Regarding an example explained in the present embodiment, five wiring layers 1MT to 5MT constitute a wiring layer portion, as described later. However, the present invention is not limited to this and the number of wiring layers may be changed appropriately in accordance with, for example, uses and specifications appropriately.

The wiring layer portion 21a on the effective pixel region 21 and the invalid pixel region 22 in the sensor portion region 20 is formed from a wiring layer 1MT including metal films 44 and the wiring layer 2MT including metal films 45. The wiring layer 2MT is laminated on the wiring layer 1MT with a capping film 43 and an interlayer insulating layer 42 therebetween. Furthermore, the wiring layer 1MT is disposed on the semiconductor substrate 11 with the interlayer insulating layer 42, and a capping film 43 and the interlayer insulating layer 42 are disposed between the wiring layer 2MT and the passivation film 51 from the wiring layer 2MT side.

In this regard, in the wiring layer portion 21a, the metal films 44 and 45 constituting the wiring layers 1MT and 2MT, respectively, are disposed at locations, at which the light incident on the photodiodes 41 through the on-chip lens 53 is not blocked. Specifically, the metal films 44 and 45 are disposed at locations other than the regions in which the on-chip lens 53 and the photodiodes 41 are opposed to each other.

Moreover, in the present embodiment, concave portions 57 are disposed on the surface of the wiring layer portion 21a in the effective pixel region 21 and the invalid pixel region 22. The concave portion 57 is disposed between adjacent metal films 45. In this regard, the concave portion 57 is disposed in such a way that the depth of the concave portion 57 reaches the capping film 43 disposed on the wiring layer 1MT.

The wiring layer portions 23a on the OPB region 23 in the sensor portion region 20 is formed from the wiring layer 1MT including the metal films 44, the wiring layer 2MT including the metal films 45, the wiring layer 3MT including a light-shielding layer 49, and the wiring layer 4MT including a light-shielding layer 50. Then, the wiring layers 1MT to 4MT are laminated on the semiconductor substrate 11 in that order.

In this regard, in the wiring layer portions 23a, the capping film 43 and the interlayer insulating layer 42 are disposed from the lower wiring layer side between the individual wiring layers. Furthermore, the wiring layer 1MT is disposed on the semiconductor substrate 11 with the interlayer insulating layer 42 therebetween, and the capping film 43 and the interlayer insulating layer 42 are disposed from the wiring layer 4MT side between the wiring layer 4MT and the passivation film 51. In this regard, in the wiring layer portion 23a, the metal films 44 and 45 constituting the wiring layers 1MT and 2MT, respectively, are disposed at locations other than the regions above the photodiodes 41.

The wiring layer portions 30a on the peripheral circuit region 30 is provided with the wiring layer 1MT including the metal films 44, the wiring layer 2MT including the metal films 45, the wiring layer 3MT including metal films 46, and the wiring layer 4MT including metal films 47. Furthermore, wiring layer portions 30a is provided with the wiring layer 5MT including metal films 48. Then, in the wiring layer portions 30a, the wiring layers 1MT to 5MT are laminated on the semiconductor substrate 11 in that order.

In this regard, in the wiring layer portions 30a, the capping film 43 and the interlayer insulating layer 42 are disposed from the lower wiring layer side between the individual wiring layers. Furthermore, the wiring layer 1MT is disposed on the semiconductor substrate 11 with the interlayer insulating layer 42 therebetween, and the interlayer insulating layer 42 is disposed between the wiring layer 5MT and the passivation film 51.

In the above-described wiring layer portions in the individual regions, the metal films 44 to 48 and the light-shielding layers 49 and 50 may be formed from, for example, copper (Cu) or aluminum (Al). In this regard, in the case where the metal films 44 to 48 and the light-shielding layers 49 and 50 are formed from copper (Cu), it is preferable that diffusion-preventing films (not shown in the drawing), formed from, for example, titanium nitride (TiN) are disposed in the vicinity of the individual films. Diffusion of copper into the interlayer insulating layer 42 may be suppressed by disposing the diffusion-preventing films.

In the present embodiment, the configurations (shape, dimension, film thickness, and the like) of the light-shielding layer 49 of the wiring layer 3MT and the light-shielding layer 50 of the wiring layer 4MT are specified to be the same. The light-shielding layers 49 and 50 may be formed from a metal film covering the entire surface of the OPB region 23 or by arranging linear metal films into the shape of a grid. Alternatively, a wiring, to which no signal pulse is applied, that is, a wiring not in use, may be used as the light-shielding layer.

The interlayer insulating layer 42 is formed from, for example, silicon oxide ($SiO_2$). The capping film 43 is formed from, for example, silicon carbide (SiC). The capping films 43 are disposed on the individual wiring layers and are used as etching stopper layers. In the case where this capping film 43 is disposed, an etching step in formation of height difference portions and concave portions in the individual wiring layers may be controlled easily. In this regard, in the configuration example shown in the present embodiment, the capping films 43 are disposed on all wiring layers in the sensor portion region 20. However, the present invention is not limited to this. The capping films 43 may be disposed on predetermined wiring layers or the configuration may include no capping film 43.

As described above, in the solid-state imaging device 10 according to the present embodiment, the film configurations of the wiring layer portions 30a, 23a, and 21a disposed on the peripheral circuit region 30, the OPB region 23, and the effective pixel region 21 and the invalid pixel region 22, respectively, are different from each other. Furthermore, the film thicknesses thereof are decreased in the order of the wiring layer portions 30a, 23a, and 21a.

As a result, a first height difference portion 55 is disposed in the vicinity of the boundary between the peripheral circuit region 30 and the OPB region 23 because of a difference between thicknesses of the wiring layer portions of the two regions. Furthermore, a second height difference portion 56 is also disposed in the vicinity of the boundary between the OPB region 23 and the invalid pixel region 22 because of a difference between thicknesses of the wiring layer portions of the two regions. Moreover, in the present embodiment, concave portions 57 are disposed on the surface of the wiring layer portions 21a in the effective pixel region 21 and the invalid pixel region 22.

That is, in the solid-state imaging device 10, a plurality of height difference portions are disposed in such a way that the heights of surfaces of the wiring layer portions are reduced gradually from the peripheral circuit region 30 toward the effective pixel region 21 in the sensor portion region 20. In addition, concave portions 57 are disposed in the effective pixel region 21.

Here, FIG. 3 shows positional relationships among the individual constituent regions, the first and the second height difference portions 55 and 56, and the concave portions 57 in the solid-state imaging device 10 according to the present embodiment. FIG. 3 is a schematic upper surface configuration diagram of the solid-state imaging device 10, and the first and the second height difference portions 55 and 56 and the concave portions 57 are indicated by broken lines.

In the present embodiment, as shown in FIG. 3, the first height difference portion 55 is disposed along the vicinity of the peripheral portion of the sensor portion region 20. The second height difference portion 56 is disposed in such a way as to surround the effective pixel region 21. Furthermore, a plurality of concave portions 57 are disposed two-dimensionally at predetermined intervals in the effective pixel region 21 and the invalid pixel region 22 surrounded by the second height difference portion 56. In this regard, in the example shown in FIG. 3, the shape of opening of the concave portion 57 is square. However, the present invention is not limited to this. The shape of opening of the concave portion 57 may be, for example, circular or polygonal, or the concave portion 57 may be formed into a groove.

Further, in the present embodiment, the height difference (distance, thickness) of the first height difference portion 55 is between 30 nm and 5000 nm, the height difference (distance, thickness) of the second height difference portion 56 is between 100 nm and 1000 nm, and the depth of each concave portion is between 50 nm and 500 nm.

Method for Manufacturing Solid-state Imaging Device

Next, a method for manufacturing the solid-state imaging device 10 according to the present embodiment will be described with reference to FIGS. 4 to 12. FIGS. 4 to 12 are diagrams showing film formation states after individual steps in the method for manufacturing the solid-state imaging device 10. In this regard, FIGS. 4 to 12 show schematic sectional views in the periphery of the boundary between the sensor portion region 20 and the peripheral circuit region 30.

Figure 4:
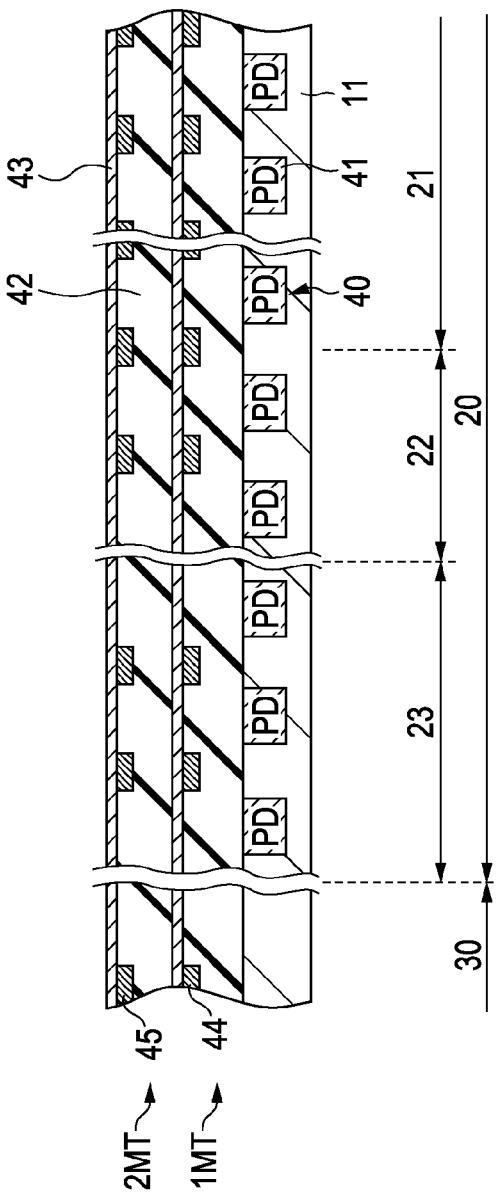
FIG. 4 is a diagram for explaining a method for manufacturing the solid-state imaging device according to the first embodiment.

Initially, a plurality of pixels 40 including photodiodes 41 and pixel transistors (not shown in the drawing) are formed two-dimensionally in the sensor portion region 20 on the surface of the semiconductor substrate 11. Thereafter, the interlayer insulating layer 42, the metal films 44 (wiring layer 1MT having a film thickness between 100 nm and 1000 nm) and the capping film 43 are formed on the semiconductor substrate 11 in that order by a technique, e.g., sputtering. Furthermore, the interlayer insulating layer 42, the metal films 45 (wiring layer 2MT having a film thickness between 50 nm and 500 nm) and the capping film 43 are formed on the capping film 43 formed on the surface of the wiring layer 1MT in that order by a technique, e.g., sputtering. FIG. 4 shows the film formation state after the above-described step.

Figure 5:
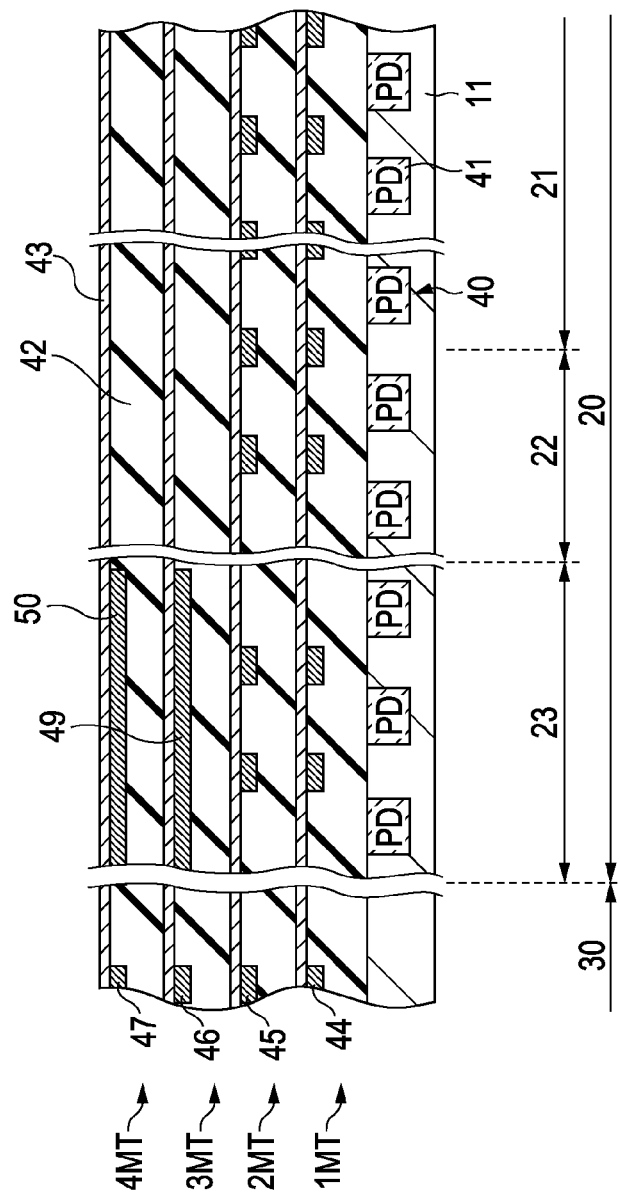
FIG. 5 is a diagram for explaining the method for manufacturing the solid-state imaging device according to the first embodiment.

Subsequently, the interlayer insulating layer 42, the wiring layer 3MT including the metal films 46 and the light-shielding layer 49, and the capping film 43 are formed on the capping film 43 formed on the surface of the wiring layer 2MT in that order by a technique, e.g., sputtering. Moreover, the interlayer insulating layer 42, the wiring layer 4MT including the metal films 47 and the light-shielding layer 50, and the capping film 43 are formed on the capping film 43 formed on the surface of the wiring layer 3MT in that order by a technique, e.g., sputtering. FIG. 5 shows the film formation state after the above-described step. The film thickness of each wiring layer 3MT or 4MT is between 50 nm and 500 nm.

Figure 6:
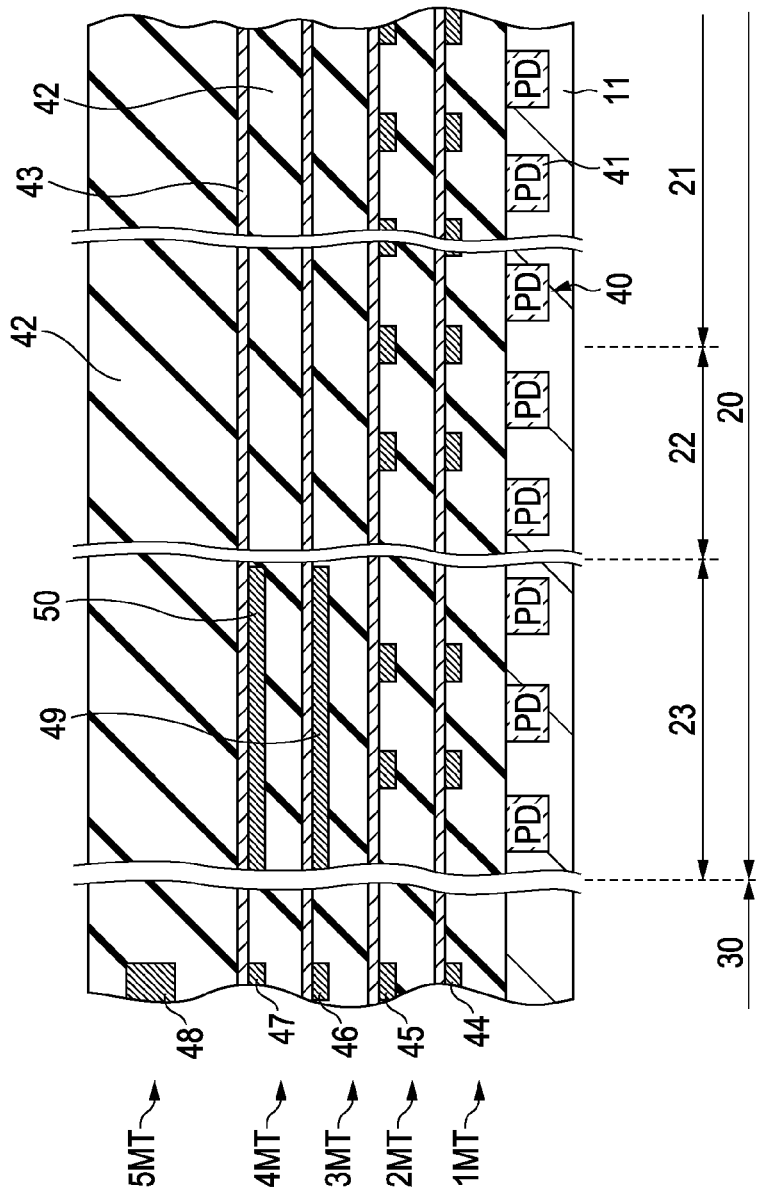
FIG. 6 is a diagram for explaining the method for manufacturing the solid-state imaging device according to the first embodiment.

Then, the interlayer insulating layer 42 and the metal films 48 (wiring layer 5MT having a film thickness between 50 nm and 6000 nm) are formed on the capping film 43 formed on the surface of the wiring layer 4MT in that order by a technique, e.g., sputtering. In addition, in the present embodiment, the interlayer insulating layer 42 is formed on the metal films 48 (wiring layer 5MT) by a technique, e.g., sputtering. FIG. 6 shows the film formation state after the above-described step. In the present embodiment, the wiring layer portions are formed on the semiconductor substrate 11 by the above-described steps.

Figure 7:
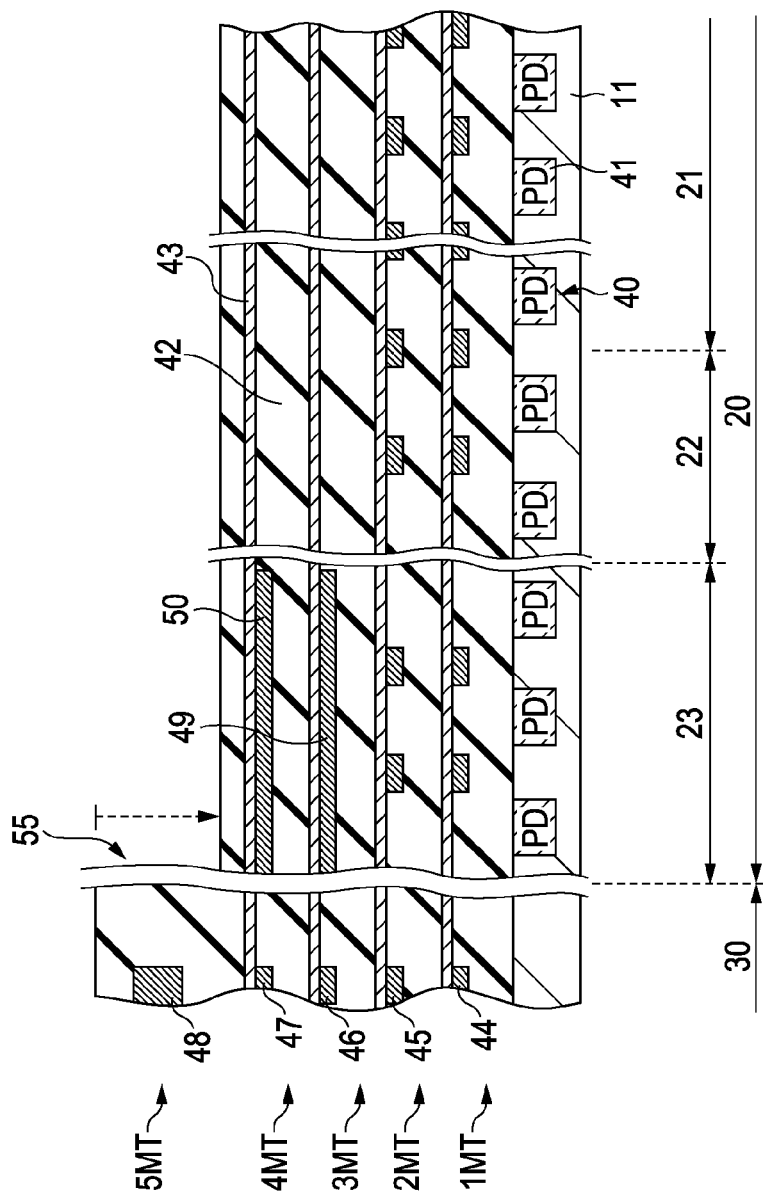
FIG. 7 is a diagram for explaining the method for manufacturing the solid-state imaging device according to the first embodiment.

Next, the peripheral circuit region 30 is masked with a resist or the like, and the surface on the wiring layer portion side is etched through, for example, dry etching or wet etching. In this manner, the wiring layer portion disposed on the sensor portion region 20 is etched from the interlayer insulating layer 42 located as the uppermost layer thereof. Then, the etching is finished while the interlayer insulating layer 42 having some thickness is left on the capping film 43 disposed on the surface of the wiring layer 4MT. In this regard, etching may be conducted until the capping film 43 is reached in such a way that the interlayer insulating layer 42 is not left. FIG. 7 shows the film formation state after the above-described etching step. The first height difference portion 55 having a height difference (distance, thickness) between 30 nm and 5000 nm is formed at the boundary between the sensor portion region 20 (OPB region 23) and the peripheral circuit region 30 by this step.

Figure 8:
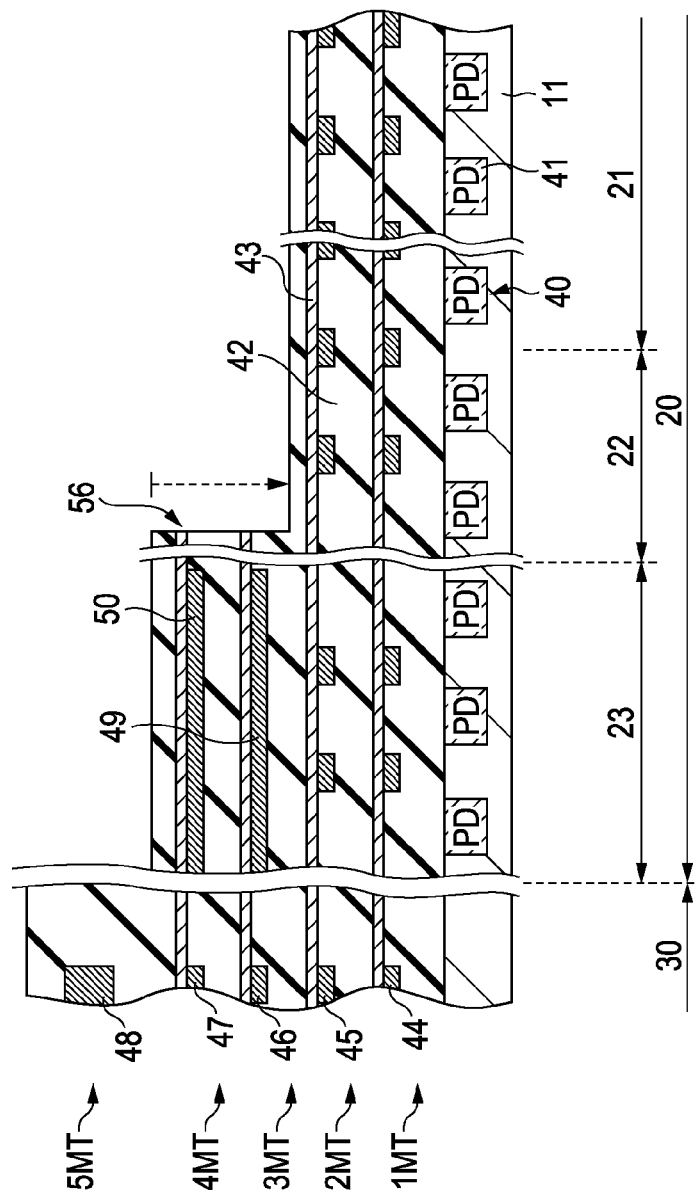
FIG. 8 is a diagram for explaining the method for manufacturing the solid-state imaging device according to the first embodiment.

Subsequently, the peripheral circuit region 30 and the OPB region 23 are masked with a resist or the like, and the surface on the wiring layer portion side is etched through, for example, dry etching or wet etching. In this manner, the wiring layer portion disposed on the invalid pixel region 22 and the effective pixel region 21 are etched from the interlayer insulating layer 42 located as the uppermost layer thereof. Then, the etching is finished while the interlayer insulating layer 42 having some thickness is left on the capping film 43 disposed on the surface of the wiring layer 2MT. In this regard, etching may be conducted until the capping film 43 is reached in such a way that the interlayer insulating layer 42 is not left. FIG. 8 shows the film formation state after the above-described etching step. The second height difference portion 56 having a height difference (distance, thickness) between 100 nm and 1000 nm is formed at the boundary between the OPB region 23 and the invalid pixel region 22 by this step.

Figure 9:
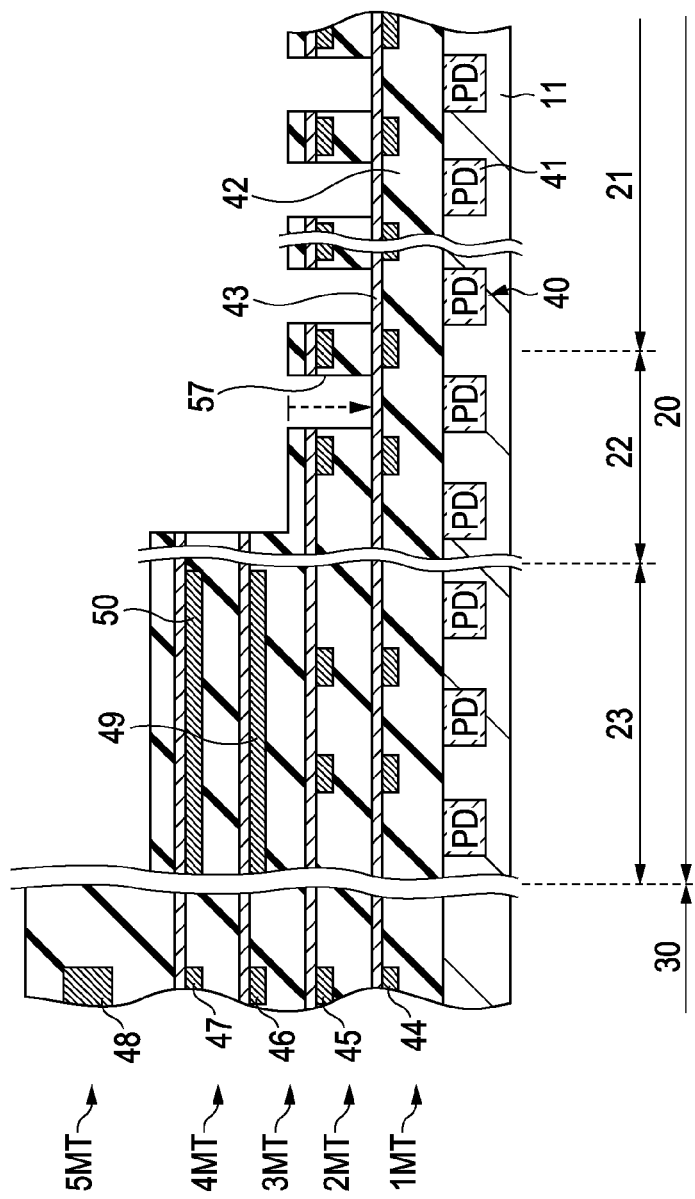
FIG. 9 is a diagram for explaining the method for manufacturing the solid-state imaging device according to the first embodiment.

Thereafter, the region other than the regions above the photodiodes 41 in the effective pixel region 21 and the invalid pixel region 22 are masked with a resist or the like, and the surface of the wiring layer portion side is etched through, for example, dry etching or wet etching. Consequently, the regions of mask opening portions (regions above the photodiodes 41) are etched. Then, etching is finished when the etching reaches the capping film 43 disposed on the surface of the wiring layer 1MT. FIG. 9 shows the film formation state after the above-described etching step. The concave portions 57 having a depth between 50 nm and 500 m are formed in the regions above the photodiodes 41 in the effective pixel region 21 and the invalid pixel region 22 by this step. In this regard, in the formation of the concave portions 57, the etching may be finished while the interlayer insulating layer 42 having some thickness is left on the capping film 43 disposed on the surface of the wiring layer 1MT. In the present embodiment, the first height difference portion 55, the second height difference portion 56, and the concave portions 57 are formed at predetermined locations, as described above.

Figure 10:
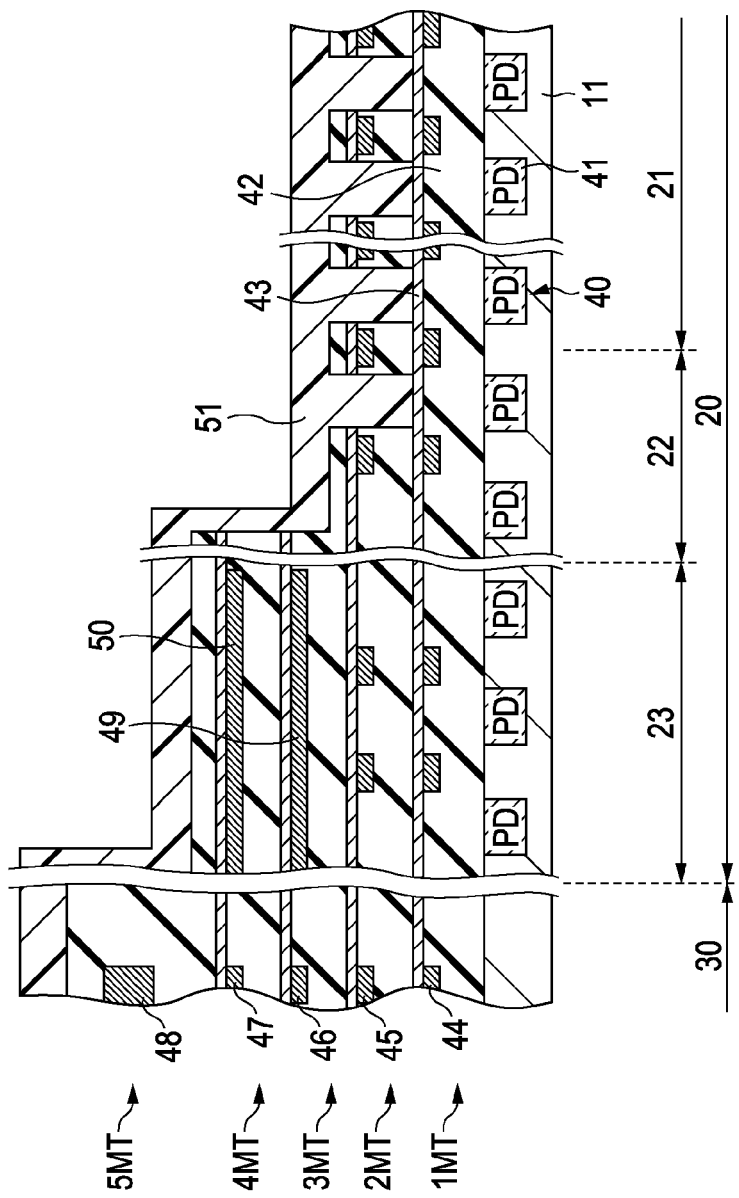
FIG. 10 is a diagram for explaining the method for manufacturing the solid-state imaging device according to the first embodiment.

Next, the passivation film 51 is formed on the wiring layer portion provided with the first height difference portion 55, the second height difference portion 56, and the concave portions 57 by, for example, a chemical vapor deposition (CVD) method. At this time, the passivation film 51 is formed all over the surfaces of the sensor portion region 20 and the peripheral circuit region 30. Furthermore, at this time, the passivation film 51 is formed having such a thickness that the concave portions 57 are filled with the passivation film 51 and the surface of the passivation film 51 in the effective pixel region 21 becomes flat. FIG. 10 shows the film formation state after the above-described step.

Figure 11:
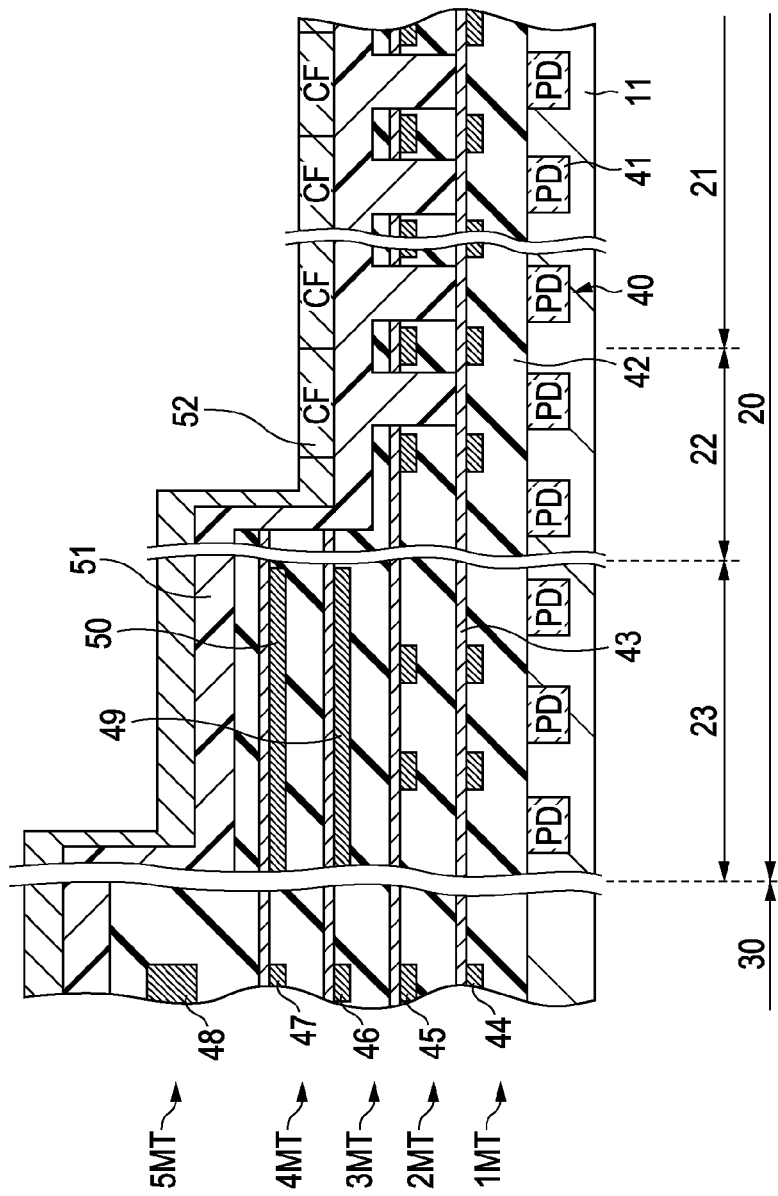
FIG. 11 is a diagram for explaining the method for manufacturing the solid-state imaging device according to the first embodiment.

Subsequently, a color filter material formed from, for example, a photoresist containing a colorant is applied to the passivation film 51, and exposure and development are conducted. In this manner, the color filter 52 is formed at a predetermined location on the invalid pixel region 22 and the effective pixel region 21. FIG. 11 shows the film formation state after the above-described step.

In this regard, as described above, in the configuration of the present embodiment, the two height difference portions are disposed in such a way that the heights of surfaces of the wiring layer portions are reduced gradually from the peripheral circuit region 30 toward the effective pixel region 21. Consequently, when the color filter material is applied to the passivation film 51 in the production step of the color filter 52, the amount of the color filter material built up in the vicinity of the individual height difference portions is reduced. As a result, the thickness of the color filter material applied to the effective pixel region 21 becomes uniform and the flatness of the color filter 52 is ensured.

Then, an on-chip lens material is applied to the layer of color filter 52. In this step as well, the amount of the on-chip lens material built up in the vicinity of the individual height difference portions is reduced, and the thickness of the on-chip lens material applied to the effective pixel region 21 becomes uniform.

Figure 12:
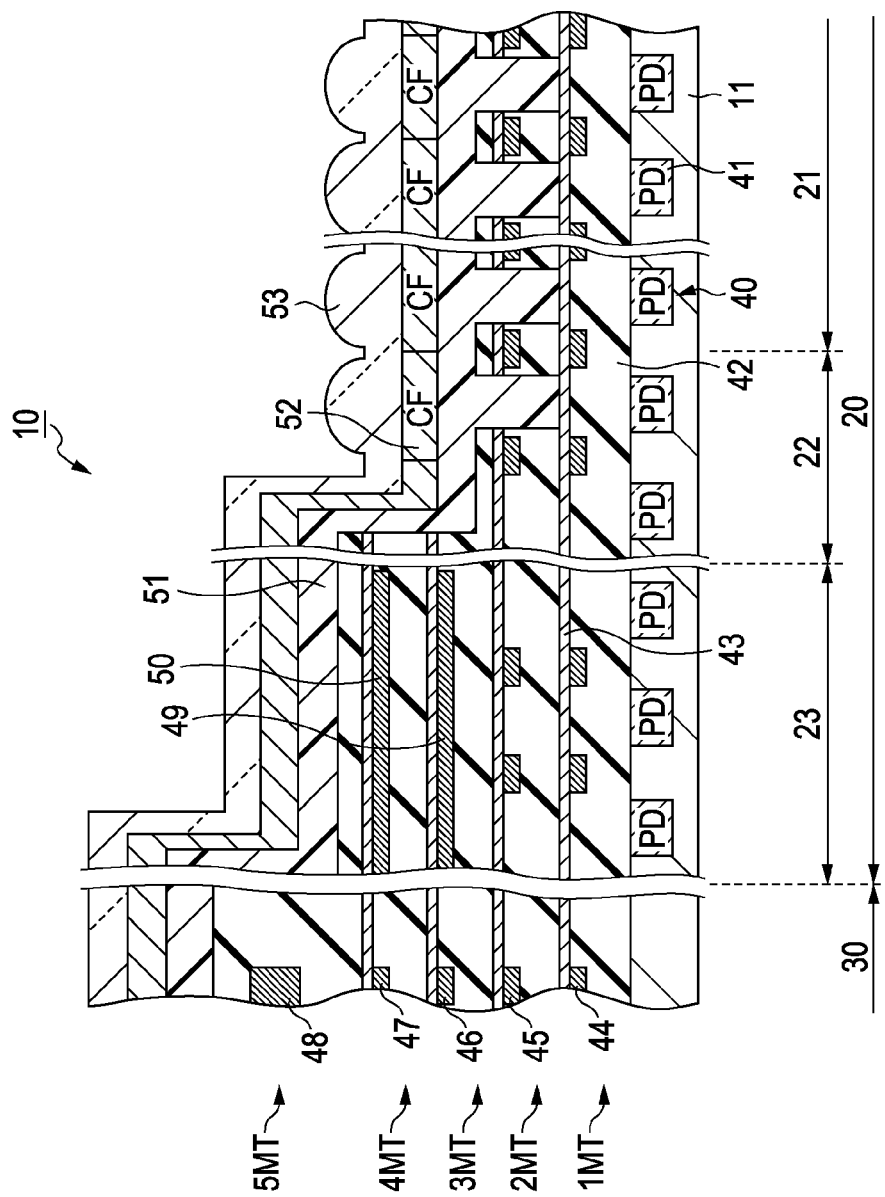
FIG. 12 is a diagram for explaining the method for manufacturing the solid-state imaging device according to the first embodiment.

Thereafter, the film surface of the on-chip lens material is patterned, so as to form the on-chip lens 53 having a predetermined shape above the photodiodes 41 in the effective pixel region 21 and the invalid pixel region 22. FIG. 12 shows the film formation state after the above-described step. In the present embodiment, the solid-state imaging device 10 is produced as described above.

In the solid-state imaging device 10 according to the present embodiment, the thickness of the wiring layer portion 21a disposed in the effective pixel region 21 and the invalid pixel region 22 is specified to be smaller than that in the OPB region 23, as described above. Therefore, in the solid-state imaging device 10 according to the present embodiment, the distance between the on-chip lens 53 and the photodiode 41 in the effective pixel region 21 may be further reduced as compared with that in FIG. 28. That is, in the present embodiment, the distance of optical path from the light incident side surface to the pixel 40 in the effective pixel region 21 may be further reduced and light scattering interface on the optical path may be reduced. As a result, in the present embodiment, pixel characteristics, e.g., sensitivity, may be further improved.

Furthermore, in the solid-state imaging device 10 according to the present embodiment, the plurality of height difference portions (first and second height difference portions 55 and 56) are disposed on the surfaces of the wiring layer portions over from the peripheral circuit region 30 to the effective pixel region 21 in the sensor portion region 20. Such a configuration exerts the following effects.

Figure 28:
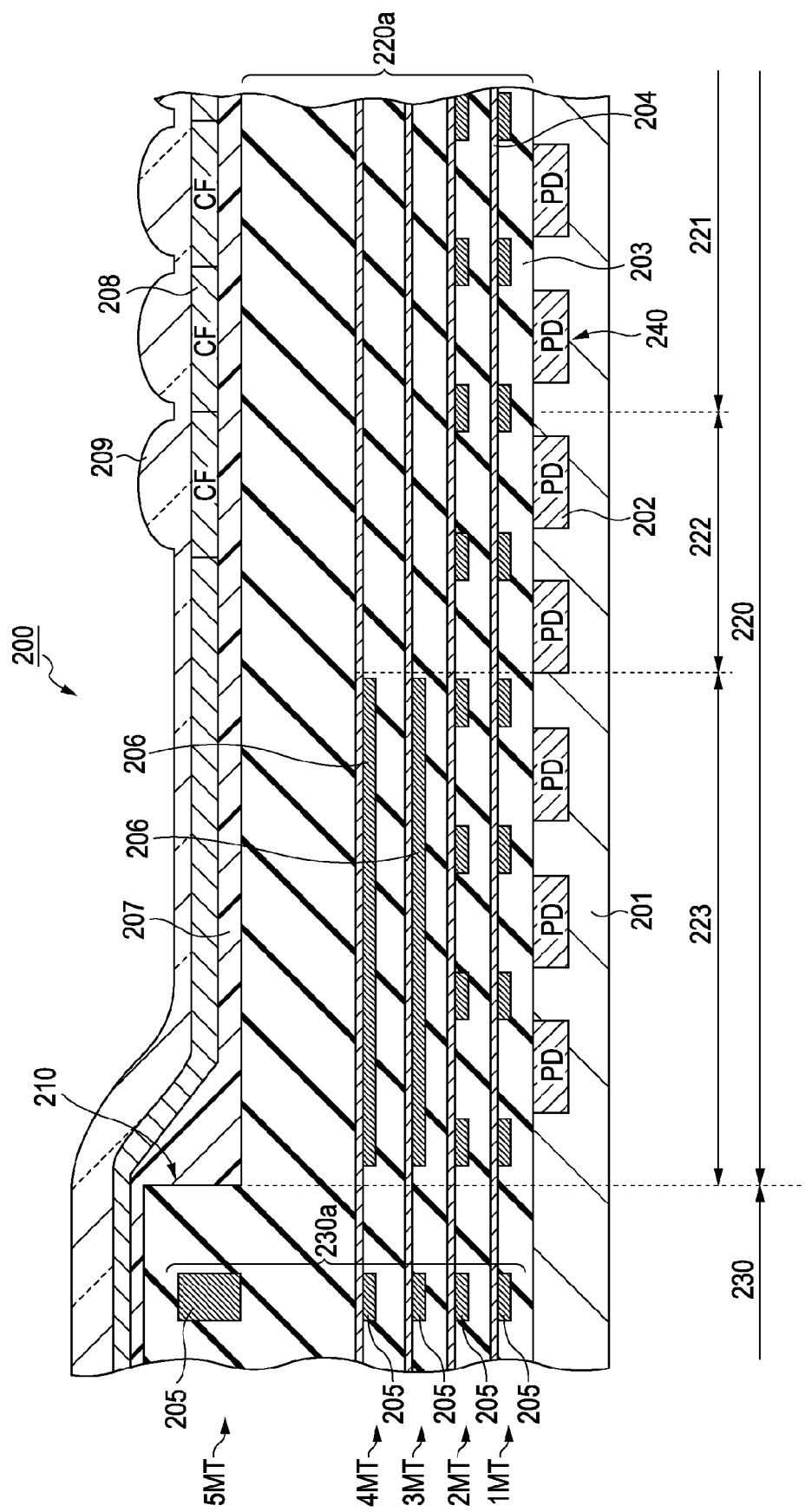
FIG. 28 is a schematic configuration diagram of a solid-state imaging device produced by Cu wiring process, having a height difference at the boundary between the sensor portion and the peripheral circuit portion.

Regarding the solid-state imaging device 200 depicted in FIG. 28, it is also considered to increase the height difference at the boundary between the peripheral circuit region 230 and the sensor portion region 220 as a technique to reduce the distance between the on-chip lens 209 and the photodiode 202. However, if the height difference between the two regions increases, problems, e.g., brushing unevenness or frame unevenness, occur in the case where the layer of color filter 208 or the layer of on-chip lens 209 is formed by a coating method. In this case, problems occur in that the flatness of the coating material is reduced and the optical characteristics deteriorate.

On the other hand, as described above, the solid-state imaging device 10 according to the present invention has the configuration, in which a plurality of height difference portions are disposed in such a way that the heights of surfaces of the wiring layer portions are reduced stepwise gradually from the peripheral circuit region 30 toward the effective pixel region 21 in the sensor portion region 20. In this case, the height differences of the individual height difference portions can be made smaller and, therefore, an occurrence of the above-described problems in the formation of the layer of color filter 52 or the layer of on-chip lens 53 through coating may be avoided. As a result, deterioration of the optical characteristics may be suppressed.

Furthermore, in the case where the concave portions 57 are disposed on the surface of the wiring layer portion 21a in the effective pixel region 21 and the invalid pixel region 22, the capping film 43 on the wiring layer 2MT in the regions above the photodiodes 41 are removed, as in the present embodiment. Consequently, in the present embodiment, deterioration of the optical characteristics may be further suppressed.

2. Second Embodiment

Configuration of Solid-state Imaging Device

Figure 13:
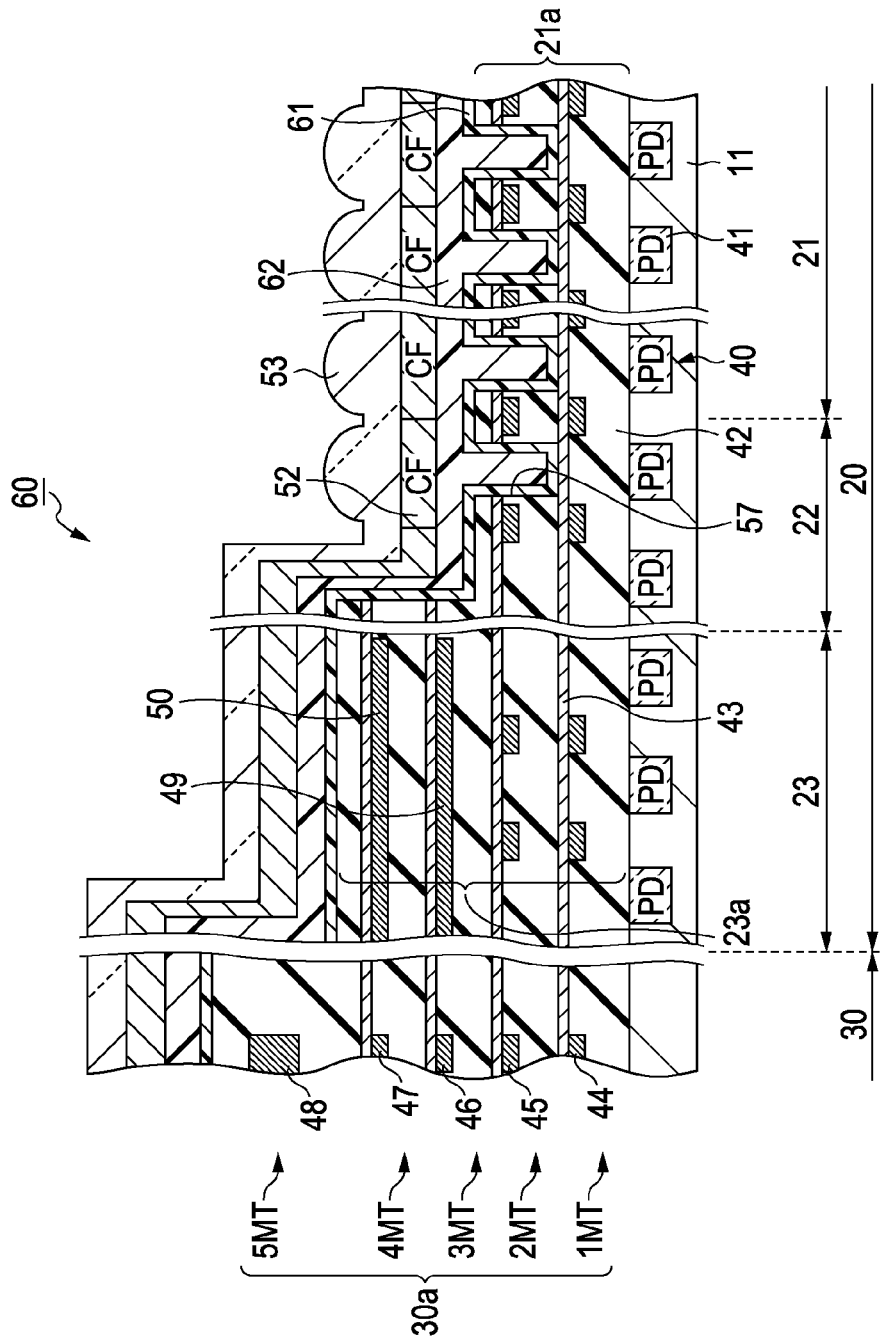
FIG. 13 is a schematic configuration sectional view of a solid-state imaging device according to a second embodiment.

FIG. 13 shows a schematic sectional configuration of a solid-state imaging device according to a second embodiment. In this regard, in FIG. 13, the same configurations as those in the above-described first embodiment (FIGS. 2 and 12) are indicated by the same reference numerals as those set forth above.

A solid-state imaging device 60 is provided with a semiconductor substrate 11, wiring layer portions 21a, 23a, and 30a, a passivation film 61, a light waveguide layer 62, a layer of color filter 52, and a layer of on-chip lens 53. The wiring layer portions 21a, 23a, and 30a, the passivation film 61, the light waveguide layer 62, the layer of color filter 52, and the layer of on-chip lens 53 are laminated on the semiconductor substrate 11 in that order. In this regard, individual regions constituting the solid-state imaging device 60 according to the present embodiment are the same as the configuration according to the above-described first embodiment (FIG. 1).

In the present embodiment, the configurations other than the configurations of the passivation film 61 and the light waveguide layer 62 are the same as the configurations (FIGS. 2 and 12) in the above-described first embodiment. Therefore, merely the passivation film 61 and the light waveguide layer 62 will be explained here.

The passivation film 61 may be formed from the same material as the material for the passivation film 51 used in the above-described first embodiment. Specifically, the passivation film 61 is formed from, for example, silicon nitride (SiN: refractive index 2.0) or the like having a refractive index higher than that of silicon oxide ($SiO_2$: 1.45) or the like, which is the material for forming the interlayer insulating layer 42.

In this regard, in the configuration of the above-described first embodiment, the film thickness of the passivation film 51 is specified to be large and the concave portions 57 disposed on the surface of the wiring layer portion 21a in the effective pixel region 21 and the invalid pixel region 22 are filled with the passivation film 51. On the other hand, in the present embodiment, as shown in FIG. 13, the film thickness of the passivation film 61 is specified to be small and the passivation film 61 is disposed in such a way as to cover the surfaces of the wiring layer portions 21a, 23a, and 30a. Consequently, in the present embodiment, concave portions are disposed on the surface of the passivation film 61 as well. In this regard, the film thickness of the passivation film 61 may be, for example, about 0.5 μm.

The light waveguide layer 62 is disposed on the passivation film 61 while having such a thickness that fills the concave portions disposed on the surface of the passivation film 61. As for the material for forming the light waveguide layer 62, for example, a material having a refractive index higher than that of silicon oxide ($SiO_2$: 1.45) or the like, which is the material for forming the interlayer insulating layer 42, is used. For example, siloxane resins, polyimide resins, and the like may be used as the material for forming the light waveguide layer 62. Furthermore, as for the material for forming the light waveguide layer 62, the above-described resin materials may contain, for example, metal oxide fine particles, e.g., titanium oxide, tantalum oxide, niobium oxide, tungsten oxide, zirconium oxide, zinc oxide, indium oxide, and hafnium oxide. In this case, the refractive index of the light waveguide layer 62 is made higher.

Method for Manufacturing Solid-state Imaging Device

Figure 14:
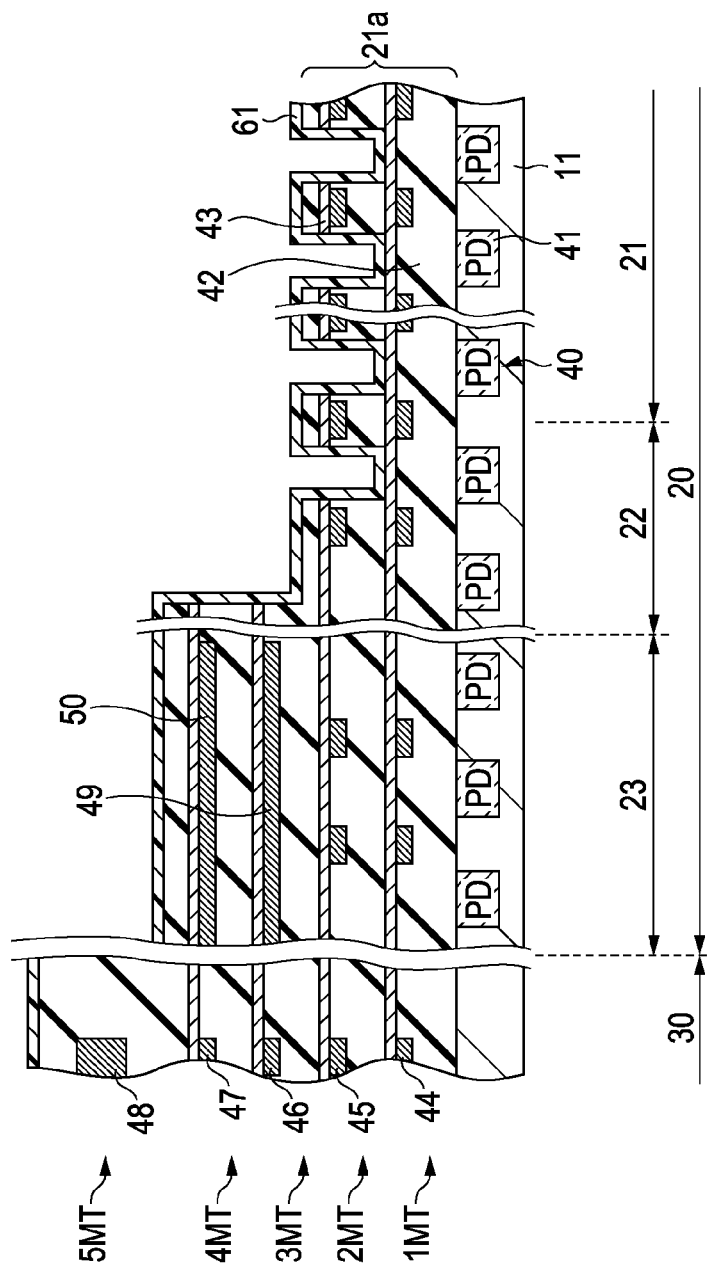
FIG. 14 is a diagram for explaining a method for manufacturing the solid-state imaging device according to a second embodiment.
Figure 15:
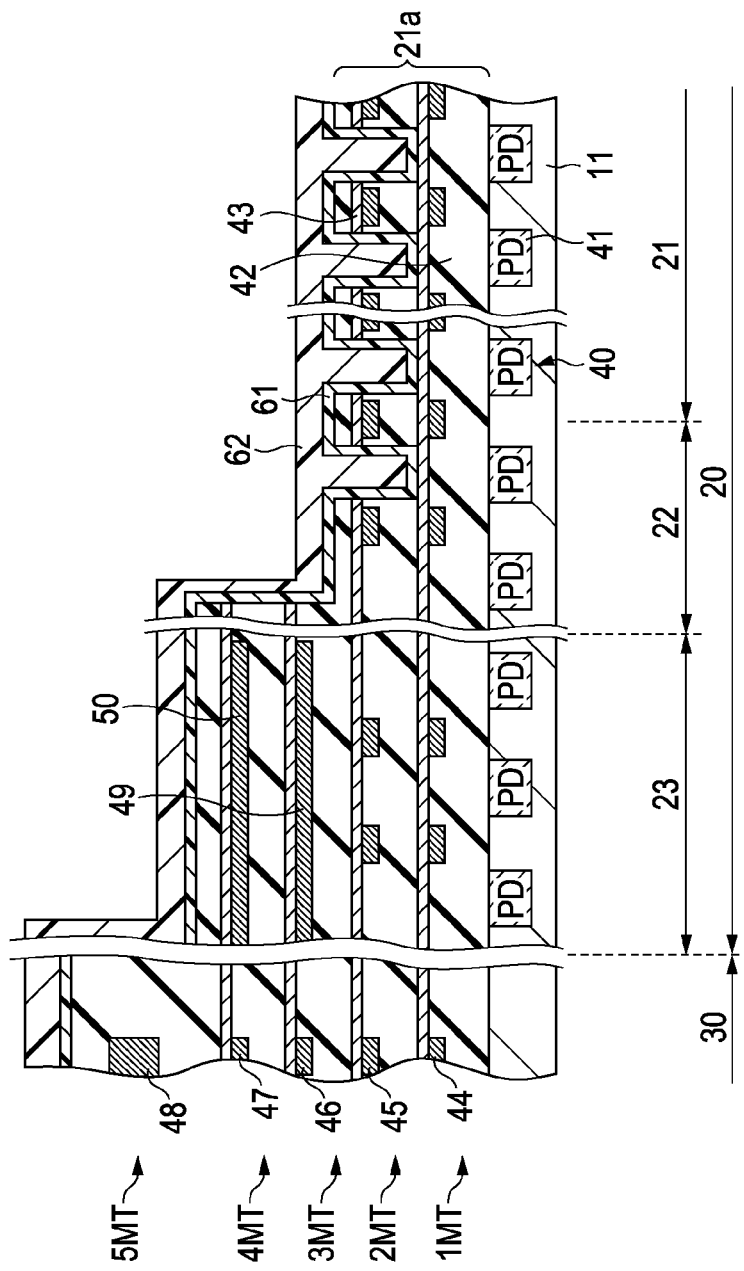
FIG. 15 is a diagram for explaining the method for manufacturing the solid-state imaging device according to the second embodiment.

Next, a method for manufacturing the solid-state imaging device 60 according to the present embodiment will be described simply with reference to FIGS. 14 and 15. In this regard, FIGS. 14 and 15 show merely steps different from the above-described method for manufacturing the solid-state imaging device 10 according to the first embodiment (FIGS. 4 to 12).

Initially, the first height difference portion 55, the second height difference portion 56, and the concave portions 57 are formed at predetermined locations on the wiring layer portion (refer to FIG. 9) in a manner similar to the steps explained in the first embodiment with reference to FIGS. 4 to 9. Subsequently, the passivation film 61 is formed on the resulting wiring layer portion by, for example, the CVD method. At this time, the passivation film 61 is formed all over the surfaces of the sensor portion region 20 and the peripheral circuit region 30 while having such a thickness that covers the surfaces of the wiring layer portions. FIG. 14 shows the film formation state after the above-described step.

Then, a material for forming the light waveguide layer 62 is applied to the passivation film 61. In this manner, the coating material is filled into the concave portions 57, and the light waveguide layer 62 having a flat surface is formed in the effective pixel region 21. FIG. 15 shows the film formation state after the above-described step.

Thereafter, the layer of color filter 52 and the layer of on-chip lens 53 are formed on the light waveguide layer 62 in a manner similar to the steps explained in the first embodiment with reference to FIGS. 11 and 12. In the present embodiment, the solid-state imaging device 60 is formed as described above.

In the present embodiment, as described above, the first height difference portion 55, the second height difference portion 56, and the concave portions 57 are formed on the surfaces of the wiring layer portions, and furthermore, the light waveguide layer 62 having a high refractive index is disposed in the region above the photodiodes 41. Consequently, in the present embodiment, the same effects as those of the first embodiment are obtained and, in addition, the solid-state imaging device 60 having further excellent optical characteristics may be provided.

Moreover, in the present embodiment, as in the first embodiment, the concave portions 57 are formed on the surface of the wiring layer portion 21a in the invalid pixel region 22 as well. In the present embodiment, for example, the following effects are also obtained by employing the above-described configuration.

Figure 16:
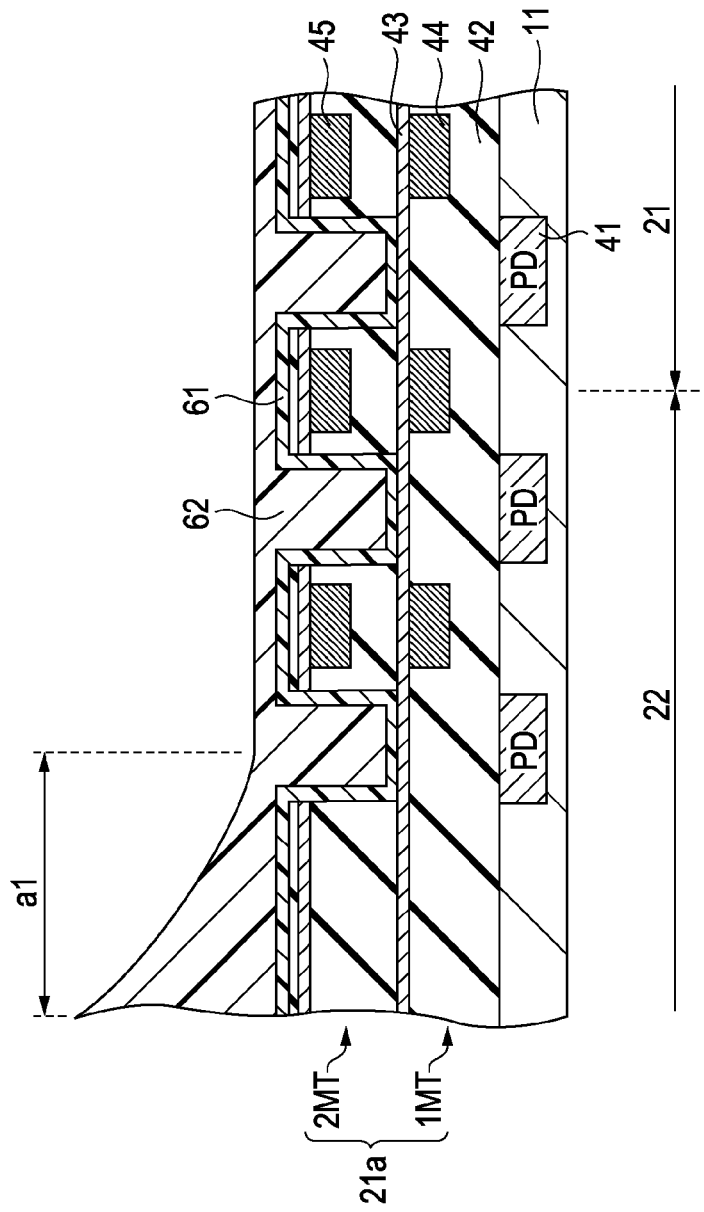
FIG. 16 is a schematic sectional view showing the shape of a coating film in the vicinity of an invalid pixel region of the solid-state imaging device according to the second embodiment.
Figure 17:
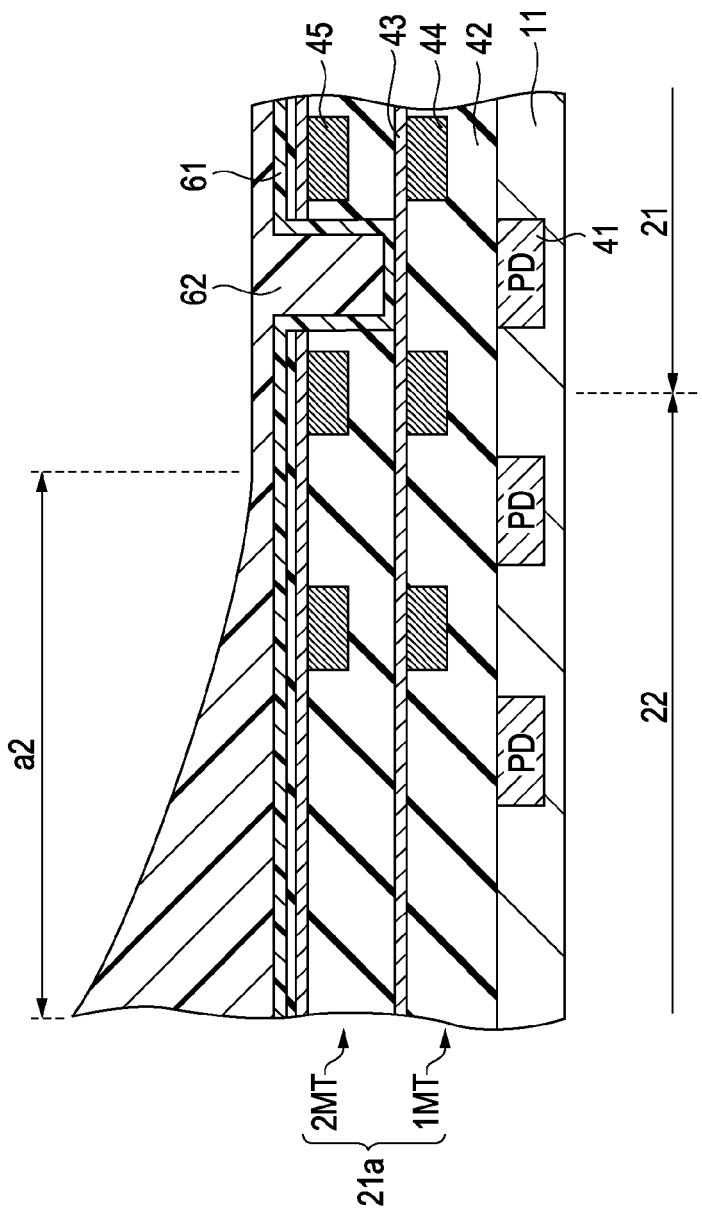
FIG. 17 is a schematic sectional view showing the shape of a coating film in the vicinity of an invalid pixel region in the case where a concave portion is not disposed in the invalid pixel region.

FIG. 16 shows the shape of a coating film in the case where the material for forming the light waveguide layer 62 is applied to the wiring layer portion 21a in the present embodiment. Furthermore, FIG. 17 shows the shape of a coating film in the case where a concave portion 57 is not disposed on the surface of the wiring layer portion 21a in the invalid pixel region 22 and the material for forming the light waveguide layer 62 is applied. Regarding the configuration shown in FIG. 17, the invalid pixel region 22 does not include a portion to absorb the coating material built up in the vicinity of the second height difference portion 56. Consequently, as shown in FIG. 17, the surface of the coating film does not become flat up to the vicinity of the boundary between the invalid pixel region 22 and the effective pixel region 21.

On the other hand, in the case where the concave portions 57 are disposed on the surface of the wiring layer portion 21a in the invalid pixel region 22, as in the present embodiment, a part of the coating material built up on the second height difference portion 56 is absorbed by (filled into) the concave portions 57. As a result, regarding the configuration of the present embodiment, as shown in FIG. 16, an area from a1 to the area where the surface of the coating film becomes flat is smaller than an area a2 in the case shown in FIG. 17. Therefore, in the present embodiment, the invalid pixel region 22 may be made small.

In this regard, in order to further improve the above-described effects, the concave portions 57 may be formed from a groove. In this case, since the amount of absorption of the coating material by the concave portion 57 increases, the area up to the are where the surface of the coating film becomes flat may be further reduced. In this case, merely the concave portions 57 in the invalid pixel region 22 may be formed from a groove, or the concave portions 57 all over the surface of the invalid pixel region 22 and the effective pixel region 21 may be formed from grooves.

Modified Example 1

In examples explained in the above-described first and second embodiments, the light-shielding layer 49 of the wiring layer 3MT and the light-shielding layer 50 of the wiring layer 4MT are specified to have the same configuration (shape, dimension, film thickness, and the like), although the present invention is not limited to this. In a modified example 1, one configuration example in the case where the light-shielding layer of the wiring layer 3MT and the light-shielding layer of the wiring layer 4MT are specified to have different configurations will be explained.

Figure 18:
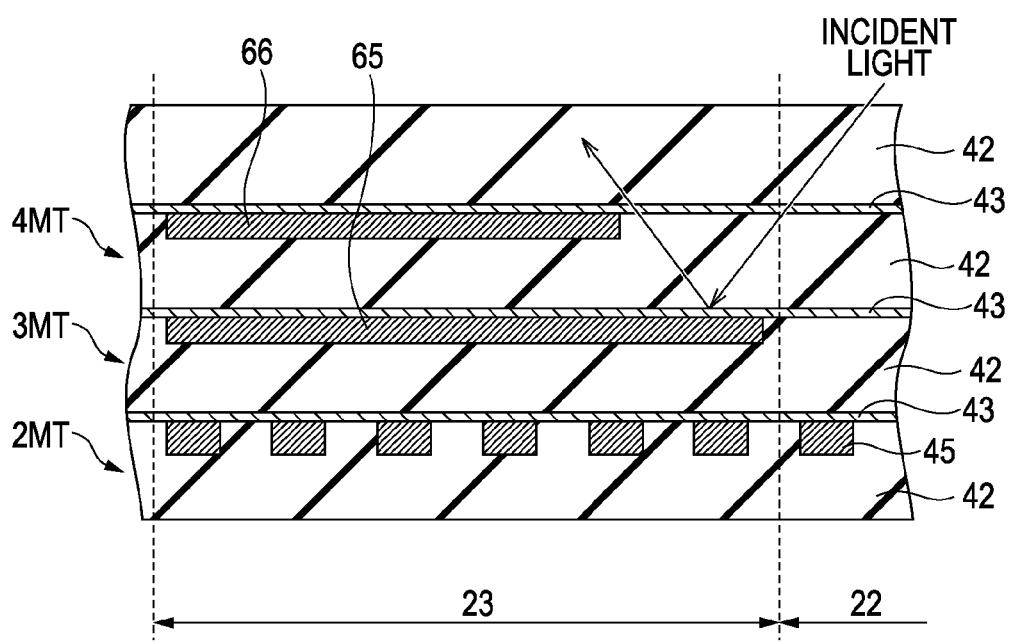
FIG. 18 is a schematic configuration diagram of an OPB region of a solid-state imaging device according to a modified example 1.

FIG. 18 shows a schematic film configuration of an OPB region 23 of a solid-state imaging device according to the present example. In this regard, FIG. 18 shows the film configurations of merely the wiring layers 2MT to 4MT in order to simplify the explanation.

In this example, in the direction from the OPB region 23 toward the invalid pixel region 22, the length of the light-shielding layer 65 of the wiring layer 3MT is specified to be larger than the length of the light-shielding layer 66 of the wiring layer 4MT. That is, in this example, the length of the light-shielding layer 65 located at the position farther from the light incident side is specified to be larger than the length of the light-shielding layer 66 located at the position nearer to the light incident side. Then, the end portion, on the invalid pixel region 22 side, of the light-shielding layer 65 of the wiring layer 3MT is disposed on the side nearer to the invalid pixel region 22 than is the end portion, on the invalid pixel region 22 side, of the light-shielding layer 66 of the wiring layer 4MT.

Figure 19:
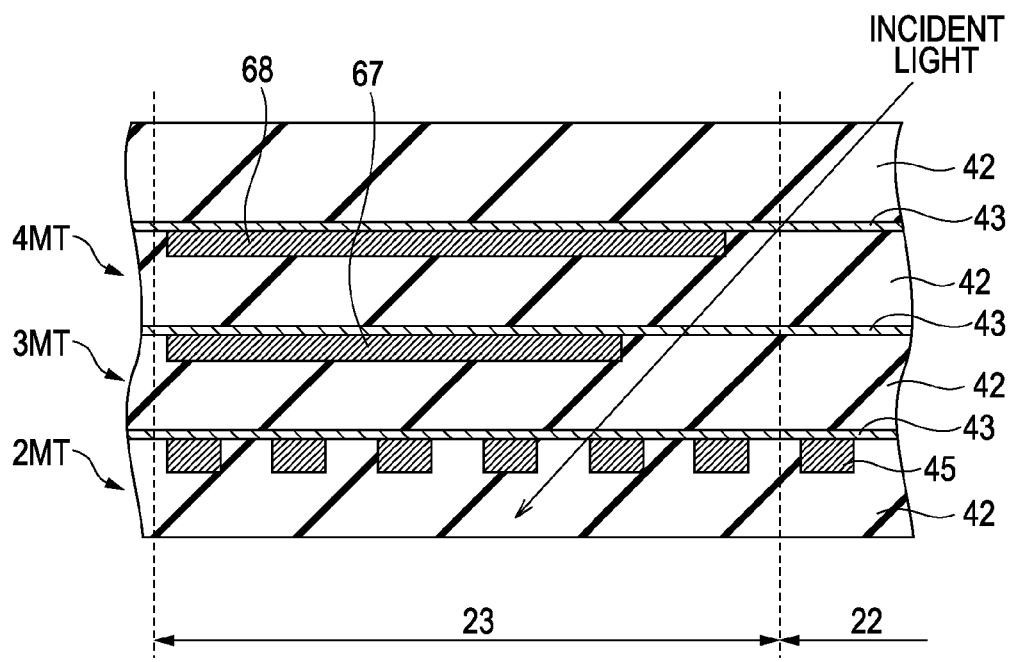
FIG. 19 is a schematic configuration diagram of an OPB region of a solid-state imaging device according to a comparative example.

The following effects are obtained by employing the above-described configuration. Here, for purposes of comparison, the case where in a direction from the OPB region 23 toward the invalid pixel region 22, the light-shielding layer of the wiring layer 3MT is longer than the light-shielding layer of the wiring layer 4MT (comparative example) will be considered. FIG. 19 shows the film configuration of the OPB region 23 according to the comparative example. Furthermore, in the comparative example, the case where the end portion, on the invalid pixel region 22 side, of the light-shielding layer 68 of the wiring layer 4MT is disposed on the side nearer to the invalid pixel region 22 than is the end portion, on the invalid pixel region 22 side, of the light-shielding layer 67 of the wiring layer 3MT will be considered.

Regarding the configuration of the comparative example, in the case where light is incident from a slanting direction relative to the surface of the light-shielding layer 68 in the vicinity of the boundary between the OPB region 23 and the invalid pixel region 22, the incident light is not reflected by the light-shielding layers 67 and 68, but is incident on wiring layer 2MT in the OPB region 23 (refer to a solid line arrow shown in FIG. 19). In this case, the light-shielding property of the OPB region 23 in the vicinity of the boundary deteriorates.

On the other hand, regarding the configuration of the modified example 1, even if the light is incident from a slanting direction relative to the surface of the light-shielding layer 66, the light is reflected by the light-shielding layer 65 of the wiring layer 3MT (refer to a solid line arrow shown in FIG. 18), so that the incident light hardly reach the wiring layer 2MT in the OPB region 23. Therefore, the light-shielding property of the OPB region 23 in the vicinity of the boundary is improved by specifying the configuration of the light-shielding layer in the OPB region 23 to be the configuration according to the modified example 1.

Figure 20:
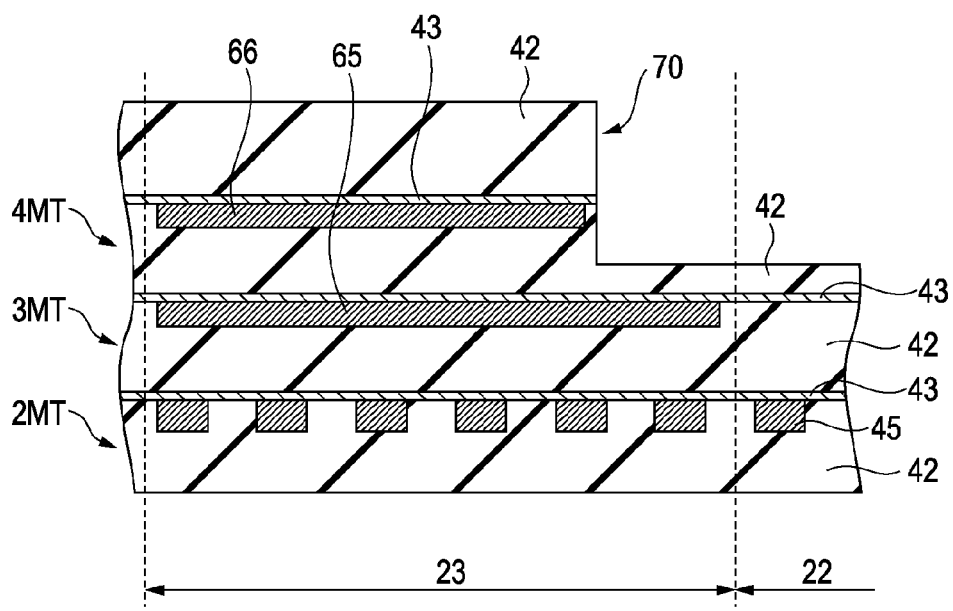
FIG. 20 is a schematic configuration diagram in the case where a height difference portion is disposed in the OPB region of the solid-state imaging device according to the modified example 1.

Moreover, regarding the configuration according to the modified example 1, the following advantages are also obtained. Regarding the OPB region 23 in the modified example 1, in a direction from the OPB region 23 toward the invalid pixel region 22, the length of the light-shielding layer 66 of the wiring layer 4MT is smaller than the length of the light-shielding layer 67 of the wiring layer 3MT. Therefore, in the OPB region 23, a region not provided with the light-shielding layer 66 of the wiring layer 4MT is present in the region of the interlayer insulating layer 42 on the light-shielding layer 65 of the wiring layer 3MT. Consequently, regarding the configuration according to the modified example 1, another height difference portion can be formed in the region, which is not provided with the light-shielding layer 66 of the wiring layer 4MT, of the interlayer insulating layer 42. FIG. 20 shows one configuration example thereof.

FIG. 20 shows an example, in which in a region above the light-shielding layer 65 of the wiring layer 3MT, one height difference portion 70 is disposed in the region, which is not provided with the light-shielding layer 66 of the wiring layer 4MT, of the interlayer insulating layer 42. However, the present invention is not limited to this. A plurality of height difference portions may be disposed in a region not provided with the light-shielding layer 66 of the wiring layer 4MT. In the case where the above-described configuration is employed, more height difference portions can be disposed on the surfaces of the wiring layer portions over from the peripheral circuit region 30 to the effective pixel region 21, so that the height difference of each height difference portion is made smaller. Therefore, in this case, the amount of coating material built up in the vicinity of the individual height difference portions may be further reduced. Consequently, the flatness of the coating film may be further improved in application of the layer of color filter 52 or the layer of on-chip lens 53.

Modified Example 2

In examples explained in the above-described first and second embodiments, the angle between the height difference surface of the second height difference portion 56 disposed at the boundary between the invalid pixel region 22 and the OPB region 23 and the surface of the wiring layer portion 21a in the invalid pixel region 22 is specified to be about 90 degrees, although the present invention is not limited to this. The angle between the height difference surface of the second height difference portion and the surface of the wiring layer portion 21a in the invalid pixel region 22 may exceed 90 degrees. That is, the second height difference portion may be formed into a tapered shape. In a modified example 2, one configuration example thereof will be described.

Figure 21:
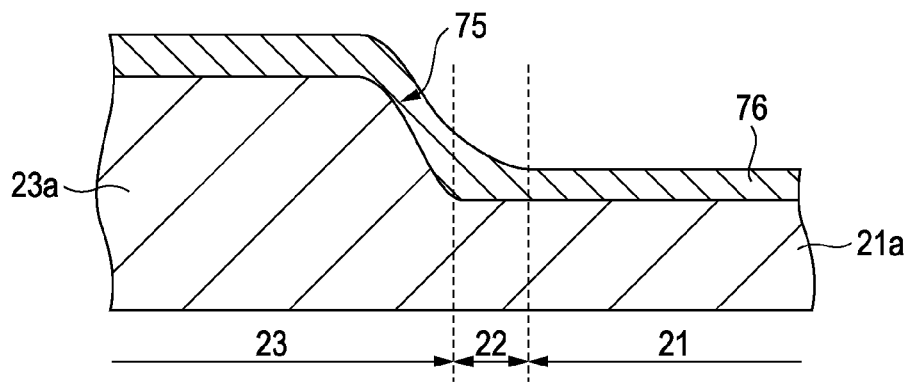
FIG. 21 is a configuration diagram of a height difference portion disposed at the boundary between an invalid pixel region and an OPB region of a solid-state imaging device according to a modified example 2.

FIG. 21 shows a schematic sectional configuration of the second height difference portion disposed at the boundary between the invalid pixel region 22 and the OPB region 23 in a solid-state imaging device according to the modified example 2. In this regard, in FIG. 21, for the sake of simplifying the explanation, merely a coating film 76, e.g., the layer of color filter 52 or the layer of on-chip lens 53, is shown on the wiring layer portion.

Such a taper-shaped second height difference portion 75 may be formed by, for example, inclining the end portion of a mask disposed on the wiring layer portion relative to a mask surface at a predetermined angle in the etching step.

Figure 22:
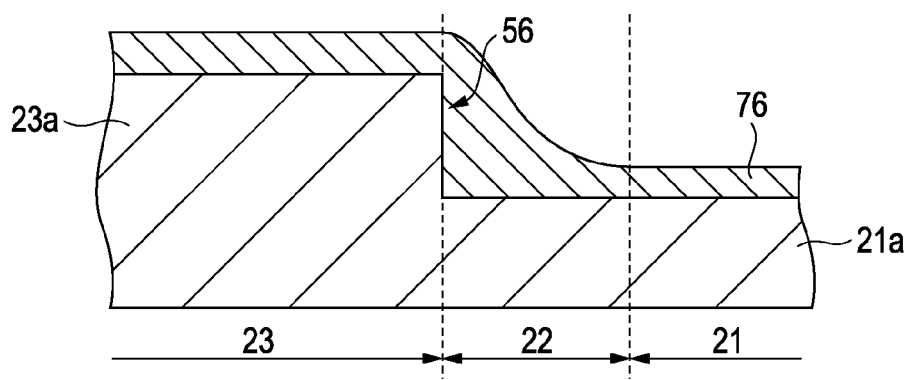
FIG. 22 is a configuration diagram of a height difference portion disposed at the boundary between an invalid pixel region and an OPB region of a solid-state imaging device according to the first embodiment.

In the case where the second height difference portion 75 has a tapered shape, the following effects are obtained. Here, FIG. 22 shows a schematic sectional configuration of the second height difference portion 56 disposed at the boundary between the invalid pixel region 22 and the OPB region 23 in the above-described embodiment. Regarding the configuration of the above-described embodiment, when the predetermined coating film 76 is applied to the wiring layer portion, some amount of coating material is built up in the vicinity of the second height difference portion 56. Consequently, it is necessary that the invalid pixel region 22 in the above-described embodiment has some area in order to flatten the coating film 76.

On the other hand, regarding the configuration of the present example, the second height difference portion 75 is formed into a tapered shape. Therefore, in application of the coating material, flowing of the coating material in the vicinity of the second height difference portion 75 may become smoother. As a result, the amount of built-up of the coating material in the vicinity of the second height difference portion 75 may be reduced, as shown in FIG. 21. Consequently, the area until the coating film 76 becomes flat may be reduced. That is, in the present example, the area of the invalid pixel region 22 may be further reduced.

In this regard, the taper-shaped height difference portion may be applied to the first height difference portion 55 disposed at the boundary between the peripheral circuit region 30 and the OPB region 23.

Modified Example 3

In examples explained in the above-described first and second embodiments, the height difference portions are disposed at the boundary between the sensor portion region 20 (OPB region 23) and the peripheral circuit region 30 and at the boundary between the OPB region 23 and the invalid pixel region 22, although the present invention is not limited to this. For example, a height difference portion may be disposed on the surface of the wiring layer portion 23a in the OPB region 23 in such a way that the surface height of the wiring layer portion 23a is reduced stepwise toward the invalid pixel region 22. In a modified example 3, one configuration example thereof will be described.

Figure 23:
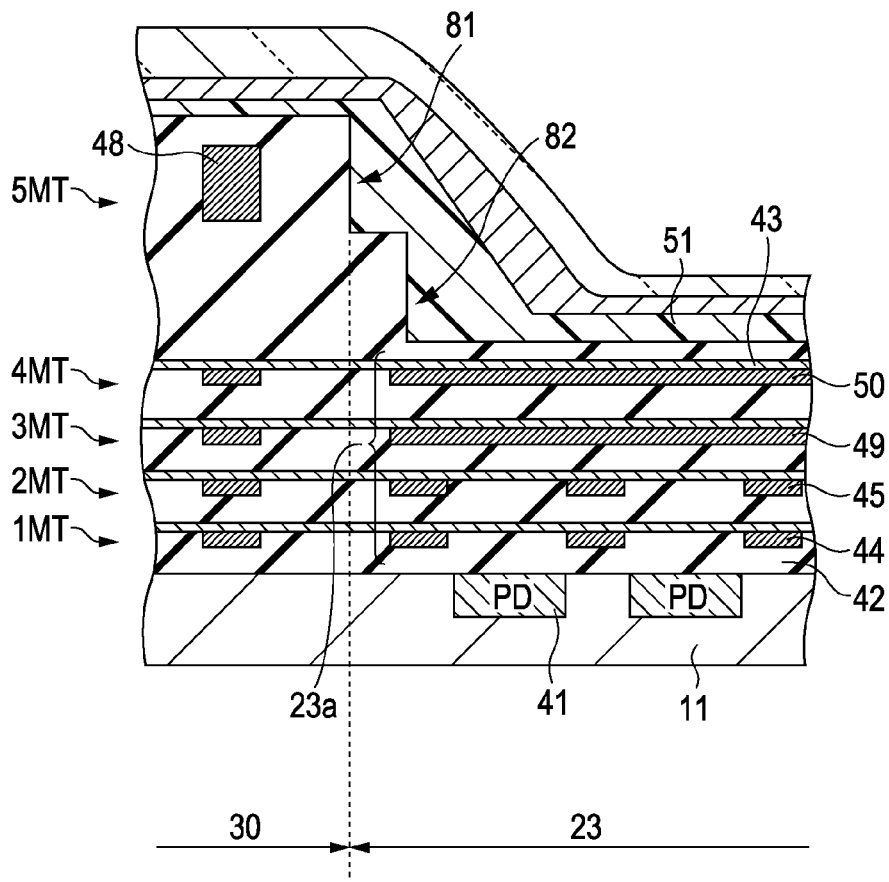
FIG. 23 is a configuration diagram of a height difference portion disposed at the boundary between a peripheral circuit region and an OPB region of a solid-state imaging device according to a modified example 3.

FIG. 23 is a schematic sectional view in the vicinity of the boundary between the OPB region 23 and the peripheral circuit region 30 of the present example. In this regard, FIG. 23 shows an example, in which besides a height difference portion 81 having a thickness between 15 nm and 2500 nm disposed at the boundary between the OPB region 23 and the peripheral circuit region 30, another height difference portion 82 having a thickness between 15 nm and 2500 nm is disposed on the surface of the wiring layer portion 23a in the OPB region 23. However, the present invention is not limited to this. At least two height difference portions may be disposed on the surface of the wiring layer portion 23a in the OPB region 23.

In the case where another height difference portion 82 is disposed on the surface of the wiring layer portion 23a in the OPB region 23, as in the present example, more height difference portions may be disposed on the surfaces of the wiring layer portions over from the peripheral circuit region 30 to effective pixel region 21, and the height difference of the individual height difference portions may be further reduced.

Consequently, in this case, the flatness of the coating film may be further improved in application of the layer of color filter 52 or the layer of on-chip lens 53.

Modified Example 4

In the configurations in the above-described first and second embodiments, the capping film 43 disposed on the wiring layer 1MT is left in the regions above the photodiodes 41, although the present invention is not limited to this. In formation of concave portions 57 in the effective pixel region 21, the capping film 43 disposed on the wiring layer 1MT may be removed through etching.

Figure 24:
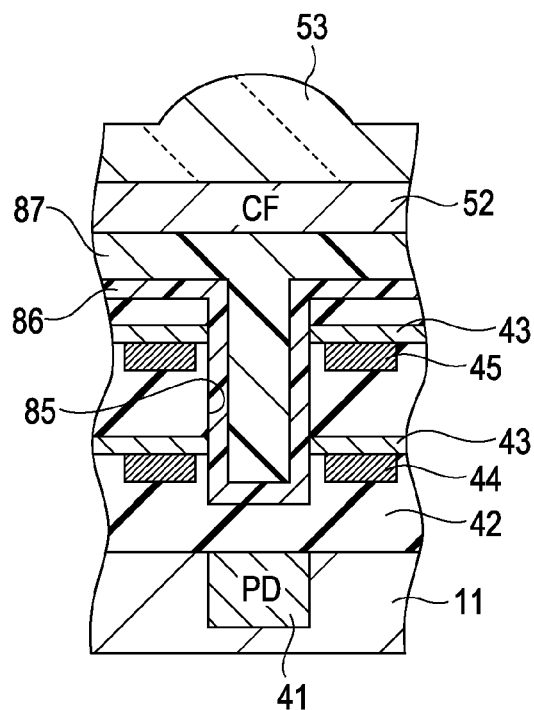
FIG. 24 is a configuration diagram of a concave portion in an effective pixel region of a solid-state imaging device according to a modified example 4.

FIG. 24 shows one configuration example (modified example 4) thereof. FIG. 24 shows a schematic sectional configuration of a film configuration disposed on one photodiode 41. In this regard, FIG. 24 shows an example, in which the configuration of the modified example 4 is applied to the solid-state imaging device according to the above-described second embodiment. However, the configuration of the modified example 4 may be applied to the solid-state imaging device according to the first embodiment likewise.

In the present example, in formation of concave portion 85 through, for example, etching in the effective pixel region 21, the etching is finished while an interlayer insulating layer 42 having some film thickness is left on the photodiode 41. Consequently, a capping film 43 disposed on the wiring layer 1MT in the region above the photodiode 41 may be removed. Thereafter, in a manner similar to that in the second embodiment, a passivation film 86, a light waveguide layer 87, a layer of color filter 52, and a layer of on-chip lens 53 are laminated on the concave portion 85 in that order.

Regarding the solid-state imaging device in the present example, the capping film 43 is not present in the region above the photodiode 41. Therefore, the optical characteristics may be further improved.

Incidentally, in examples explained in the above-described modified examples 1 to 4, individual configurations are separately applied to the above-described first and/or second embodiment, although the present invention is not limited to this. The configurations of the above-described modified examples 1 to 4 may be used in combination appropriately.

In the first and second embodiments and the modified examples 1 to 4, the solid-state imaging devices, in which the OPB region 23 having the light-shielding layer is disposed in the sensor portion region 20, are described, although the present invention is not limited to them. Likewise, the present invention can be applied to a solid-state imaging device, in which the OPB region 23 having the light-shielding layer is disposed in the peripheral circuit region 30, and the same effects are obtained.

Furthermore, in the first and second embodiments and the modified examples 1 to 4, the solid-state imaging devices provided with the capping film 43 are described, although the present invention is not limited to them. The present invention can also be applied to a solid-state imaging device not provided with the capping film 43, and the same effects are obtained. In this case, the concave portions 57 are not necessarily disposed in the effective pixel region 21.

Moreover, in the above-described second embodiment, the solid-state imaging device, in which the concave portions 57 are disposed in the invalid pixel region 22, is described, although the present invention is not limited to this. In the case where the flatness of the coating film applied to the wiring layer portion 21a in the effective pixel region 21 can be ensured sufficiently by a plurality of height difference portions disposed over from the peripheral circuit region 30 to the effective pixel region 21, the concave portions 57 are not necessarily disposed in the invalid pixel region 22.

3. Third Embodiment

The above-described solid-state imaging devices according to the embodiments of the present invention may be applied to electronic apparatuses, e.g., cameras provided with solid-state imaging devices, portable apparatuses with cameras, and other electronic apparatuses provided with solid-state imaging devices. In the third embodiment, an example, in which the solid-state imaging device according to an embodiment of the present invention is applied to a camera, will be described as an example of such electronic apparatuses.

Figure 25:
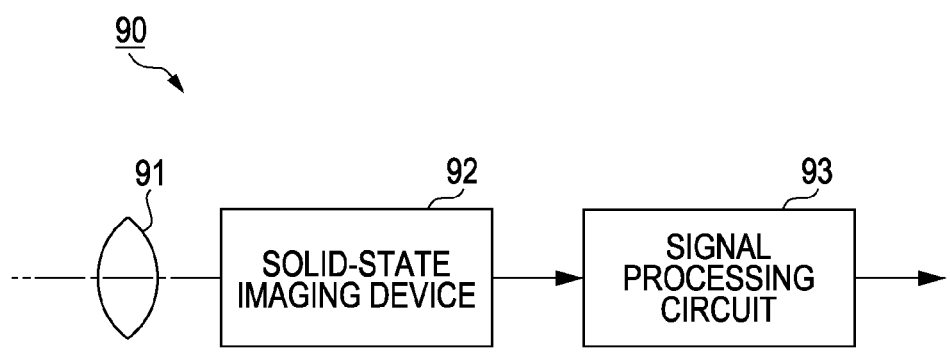
FIG. 25 is a schematic configuration diagram of an electronic apparatus according to a third embodiment.
Figure 26:
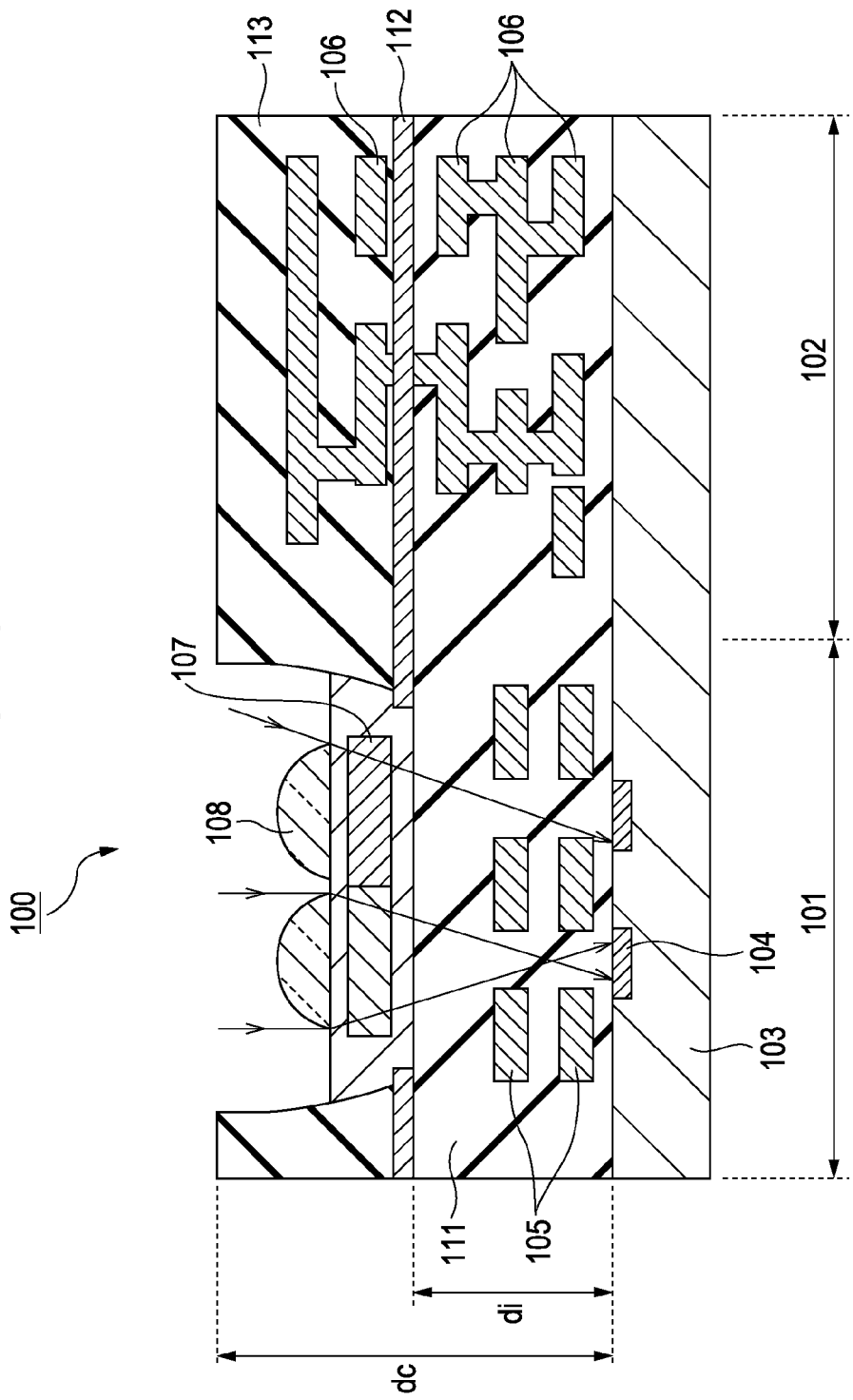
FIG. 26 is a schematic configuration diagram of a solid-state imaging device in a related art.
Figure 27:
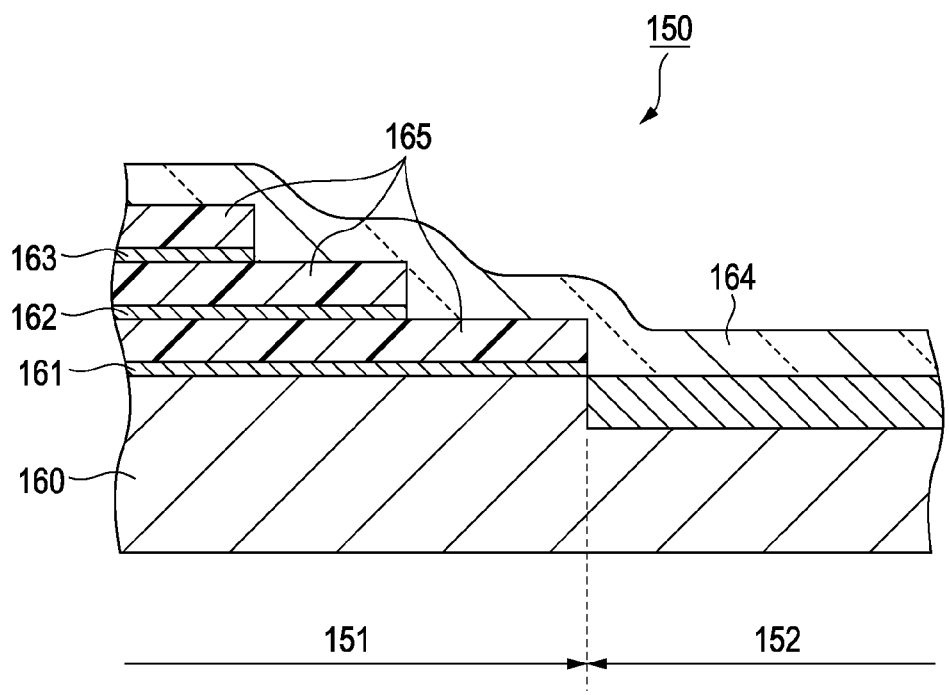
FIG. 27 is a schematic configuration diagram of a solid-state imaging device in a related art.

FIG. 25 shows a schematic configuration of a camera according to the present embodiment. A camera 90 according to the present embodiment is provided with an optical system 91 (optical lens), a solid-state imaging device 92, and a signal processing circuit 93.

The optical system 91 forms an image of image light (incident light) from a subject on an imaging surface of the solid-state imaging device 92. Consequently, a signal charge is accumulated for a predetermined period in a photodiode (photoelectric conversion element) of the solid-state imaging device 92. The solid-state imaging device according to any one of the above-described embodiments and the modified examples is applied to the solid-state imaging device 92. Then, the signal processing circuit 93 subjects output signals from the solid-state imaging device 92 to various signal processing treatments and outputs.

In this regard, the camera 90 according to the present embodiment may be not only used in the form of a camera alone, but also used in the form of a camera module, in which the optical system 91, the solid-state imaging device 92, and the signal processing circuit 93 are modularized. Specifically, a modularized camera 90 according to the present embodiment may be applied to a portable apparatus with camera and the like typified by, for example, a cellular phone provided with the camera module.

According to the electronic apparatus of the present embodiment, an electronic apparatus, in which the pixel characteristics of the solid-state imaging device is excellent and sensitivity variation and color variation are reduced, may be provided.

It should be understood by those skilled in the art that various modifications, combinations, sub-combinations and alterations may occur depending on design requirements and other factors insofar as they are within the scope of the appended claims or the equivalents thereof.

What is claimed is:
1. A solid state imaging device comprising:
a semiconductor substrate having a plurality of photodiodes thereon and a first wiring portion, a second wiring portion and a third wiring portion;
a boundary between the first wiring portion and the second wiring portion;
a first wiring layer over the semiconductor substrate and which includes a plurality of metal films and extends across all the wiring portions;
a second wiring layer over the first wiring layer and which extends across the first wiring portion and the second wiring portion; and
a third wiring layer over the second wiring layer and which extends across the first wiring portion and includes a plurality of metal films, wherein a primary height of the first wiring portion at approximately the boundary is different than a secondary height of the second wiring portion at approximately the boundary, and wherein the second wiring layer is comprised of an upper layer located closer to the third wiring layer and which includes a shielding film and a lower layer which is closer to the first wiring layer and which includes a shielding film, and the shielding film in the lower layer is closer to the boundary between the first wiring portion and second wiring portion than the shielding film in the upper layer.

2. The solid state imaging device of claim 1, wherein each of the wiring layers includes an insulating layer.

3. The solid state imaging device of claim 1, wherein the distance from a surface of the first wiring layer to a surface of the second wiring layer is between 100 nm and 1000 nm.

4. The solid state imaging device of claim 1, wherein at least one of the first wiring layer and the second wiring layer includes a capping film.

5. The solid state imaging device of claim 1, wherein the first wiring portion is a peripheral circuit region, the second wiring portion is an optical black region and the third wiring portion is a pixel region.

6. The solid state imaging device of claim 1, further comprising a plurality of concave portions between the metal films over the third wiring portion.

7. The solid state imaging device of claim 1, wherein the first wiring layer is directly on the substrate.

8. The solid state imaging device of claim 1, wherein the second wiring layer is directly on the first wiring layer, and the third wiring layer is directly on the second wiring layer.

9. The solid state imaging device of claim 1, wherein each wiring layer is separated by a capping layer and an insulating layer.

10. The solid state imaging device of claim 1, wherein the metal films in the first wiring layer are not located over the photodiodes in the semiconductor substrate.

11. The solid state imaging device of claim 1, wherein film thicknesses of the wiring layers decreases in order from the third wiring layer to the first wiring layer.

12. The solid state imaging device of claim 1, wherein the first wiring portion is a peripheral circuit region, the second wiring portion is an optical black region and the third wiring portion is a pixel region.

13. The solid state imaging device of claim 6, wherein a light waveguide layer is formed on the concave portions.

14. The solid state imaging device of claim 11, wherein the difference in the film thickness between the second wiring layer and the first wiring layer creates a first height difference portion at approximately the boundary of the first wiring portion and the second wiring portion.

15. The solid state imaging device of claim 11, wherein the difference in the film thickness between the third wiring layer and the second wiring layer creates a second height difference portion at approximately the boundary of the second wiring portion and the third wiring portion.

16. The solid state imaging device of claim 15, wherein the second height difference portion has a tapered shape.

17. A method of creating a solid state imaging device comprising the steps of:

forming a plurality of photodiodes in a third wiring portion of a semiconductor substrate which has a first wiring portion, a second wiring portion and the third wiring portion, and having a boundary between the first wiring portion and the second wiring portion;

forming over the semiconductor substrate a first wiring layer which includes a plurality of metal films and which extends across all the wiring portions; and forming over the first wiring layer a second wiring layer which extends over the first wiring portion and the second wiring portion;

forming over the first wiring layer a third wiring layer which extends across the first wiring portion and includes a plurality of metal films, wherein a primary height of the first wiring portion formed at approximately the boundary is different than a secondary height of the second wiring portion formed at approximately the boundary, and wherein the second wiring layer is comprised of an upper layer located closer to the third wiring layer and which includes a shielding film and a lower layer which is closer to the first wiring layer and which includes a shielding film, and the shielding film in the lower layer is closer to the boundary between the first wiring portion and second wiring portion than the shielding film in the upper layer.

18. The method of claim 17, further comprising the step of forming a plurality of concave portions in the first wiring layer between the metal films over the third wiring portion after the step of forming the first wiring layer.

19. The method of claim 17, wherein the second wiring layer is formed to include a plurality of shielding films.

20. The method of claim 18, further comprising the step of forming a light waveguide layer on the concave portions.

21. The method of claim 20, wherein the light waveguide layer is applied to a passivation film formed on a surface of the concave portions.

22. An electronic apparatus comprising: an optical system; and a solid-state imaging device which receives light from the optical system, the solid-state imaging device including:

a semiconductor substrate having a plurality of photodiodes thereon and a first wiring portion, a second wiring portion and a third wiring portion;

a boundary between the first wiring portion and the second wiring portion;

a first wiring layer over the semiconductor substrate and which includes a plurality of metal films and extends across all the wiring portions;

a second wiring layer over the first wiring layer and which extends across the first wiring portion and the second wiring portion; and a third wiring layer over the second wiring layer and which extends across the first wiring portion and includes a plurality of metal films, wherein a primary height of the first wiring portion at approximately the boundary is different than a secondary height of the second wiring portion at approximately the boundary, and wherein the second wiring layer is comprised of an upper layer located closer to the third wiring layer and which includes a shielding film and a lower layer which is closer to the first wiring layer and which includes a shielding film, and the shielding film in the lower layer is closer to the boundary between the first wiring portion and second wiring portion than the shielding film in the upper layer.

23. The electronic apparatus of claim 22, wherein each of the wiring layers includes an insulating layer.

24. The electronic apparatus of claim 22, wherein a thickness of the second wiring layer is between 100 nm and 1000 nm.

25. The electronic apparatus of claim 22, wherein at least one of the first wiring layer and the second wiring layer includes a capping film.

* * * * *